United States Patent
Forgey et al.

(10) Patent No.: US 11,207,697 B2
(45) Date of Patent: Dec. 28, 2021

(54) ADJUSTABLE FLOW NOZZLE SYSTEM

(71) Applicant: OEM Group, LLC, Gilbert, AZ (US)

(72) Inventors: Christian K. Forgey, Round Rock, TX (US); Alexander Trufanov, Souderton, PA (US); Joshua A. Levinson, Gilbert, AZ (US); Darren O. O'Reilly, Gilbert, AZ (US)

(73) Assignee: SHELLBACK SEMICONDUCTOR TECHNOLOGY, LLC, Gilbert, AZ (US)

(*) Notice: Subject to any disclaimer, the term of this patent is extended or adjusted under 35 U.S.C. 154(b) by 60 days.

(21) Appl. No.: 16/774,511

(22) Filed: Jan. 28, 2020

(65) Prior Publication Data

US 2020/0238308 A1    Jul. 30, 2020

Related U.S. Application Data

(60) Provisional application No. 62/797,815, filed on Jan. 28, 2019.

(51) Int. Cl.
| | | |
|---|---|---|
| *B05B 1/30* | (2006.01) | |
| *B05B 15/65* | (2018.01) | |
| *B05B 1/20* | (2006.01) | |
| *B05B 1/16* | (2006.01) | |

(52) U.S. Cl.
CPC .......... *B05B 1/3026* (2013.01); *B05B 1/1609* (2013.01); *B05B 1/169* (2013.01); *B05B 1/20* (2013.01); *B05B 1/202* (2013.01); *B05B 15/65* (2018.02)

(58) Field of Classification Search
CPC ....... B05B 1/3026; B05B 15/65; B05B 1/202; B05B 1/169; B05B 1/1609; B05B 1/20

USPC ............................................. 239/11, 548, 550
See application file for complete search history.

(56) References Cited

U.S. PATENT DOCUMENTS

| | | | |
|---|---|---|---|
| 2,088,410 | A | 7/1937 | Everson |
| 2,510,356 | A | 6/1950 | Werts |
| 3,341,168 | A | 9/1967 | Toeppen |
| 4,050,633 | A | 9/1977 | Courson |
| 5,138,937 | A | 8/1992 | Zietlow |
| 5,749,518 | A | 5/1998 | Wang |
| 5,862,987 | A | 1/1999 | Reif |
| 7,083,121 | B2 | 8/2006 | Huffman |
| 8,104,697 | B2 | 1/2012 | Petrovic |
| 2005/0035225 | A1* | 2/2005 | Huffman ............... B05B 7/0884 239/548 |

(Continued)

FOREIGN PATENT DOCUMENTS

| | | |
|---|---|---|
| CN | 101862714 A | 10/2010 |
| CN | 105073268 A | 11/2015 |

(Continued)

OTHER PUBLICATIONS

Extended European Search Report from related Application No. 18751396.5, dated Nov. 23, 2020, 9 pages.

(Continued)

*Primary Examiner* — Steven J Ganey
(74) *Attorney, Agent, or Firm* — Polsinelli PC; Ari M. Bai

(57) ABSTRACT

Various embodiments for an adjustable flow nozzle system having a manifold with a plurality of adjustable flow nozzles in which the flow rate of each adjustable flow nozzle may be individually adjusted are described herein.

18 Claims, 22 Drawing Sheets

(56) References Cited

U.S. PATENT DOCUMENTS

| | | |
|---|---|---|
| 2009/0236438 A1 | 9/2009 | Petrovic |
| 2015/0328656 A1 | 11/2015 | Perez |
| 2018/0221894 A1 | 8/2018 | Forgey et al. |
| 2018/0318850 A1 | 11/2018 | Wen |

FOREIGN PATENT DOCUMENTS

| | | |
|---|---|---|
| JP | 34-7854 | 2/1961 |
| JP | 3-119447 | 12/1991 |

OTHER PUBLICATIONS

International Search Report and Written Opinion regarding PCT/US2020/015384, dated Apr. 20, 2020.
Office Action received in corresponding Japanese Application No. 2019-565162, dated Aug. 31, 2020, 5 pages.
Office Action issued in corresponding Chinese Application No. 201880010979.7 dated Oct. 12, 2020.

* cited by examiner

Fully Open

Partially Open

Partially Closed

Fully Closed

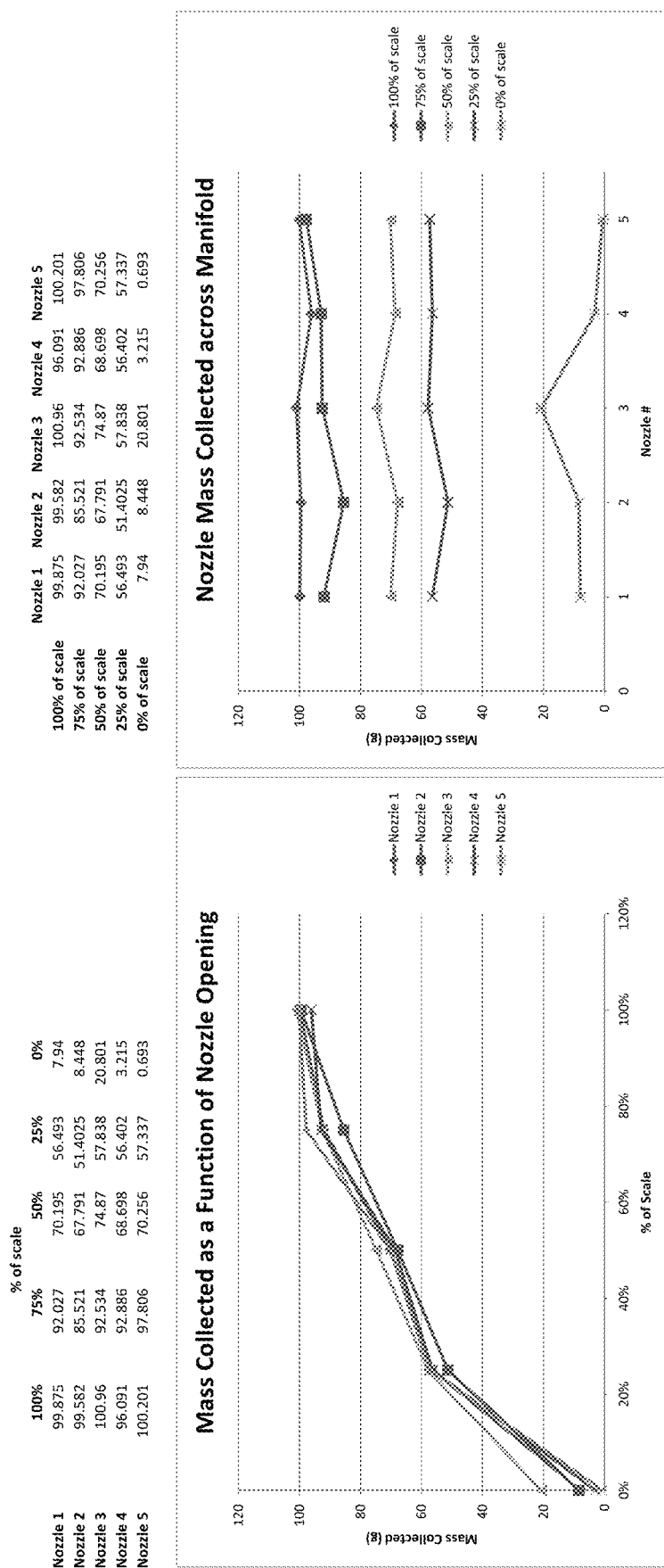

__US 11,207,697 B2__

ADJUSTABLE FLOW NOZZLE SYSTEM

CROSS REFERENCE TO RELATED APPLICATIONS

This is a non-provisional application that claims benefit to U.S. provisional application Ser. No. 62/797,815 filed on Jan. 28, 2019, which is herein incorporated by reference in its entirety.

FIELD

The present disclosure relates to an adjustable flow nozzle system; and in particular, to an adjustable flow nozzle system that adjusts the cross-sectional area of a collective opening formed by each adjustable flow nozzle by selective rotation of one component relative to another component with each component having a respective opening in overlapping arrangement with respect to one other to form the collective opening for controlling the flow rate of each individual adjustable flow nozzle.

BACKGROUND

Semiconductor processing involves selective removal of semiconducting materials, polymers or metals from the surface of base wafers including silicon. This is accomplished through spraying various chemicals—corrosive agents or solvents—on a batch of wafers. One of the many factors that influences the removal rate is the flow rate (or volume) of liquid moving through the spray nozzles. Currently, the adjustment of flow through each spray nozzle is done at the "macro" level by adjusting the total flow to all of the spray nozzles in the manifold at once. Individual spray nozzles can also be changed within the manifold, but this individual adjustment of each spray nozzle is both time consuming and may not precisely adjust the flow of liquid through each respective spray nozzle.

It is with these observations in mind, among others, that various aspects of the present disclosure were conceived and developed.

BRIEF DESCRIPTION OF THE DRAWINGS

FIG. 47 is a graphical representation showing mass collected as a function of nozzle opening for the adjustable flow nozzle system.

FIG. 48 is a graphical representation showing the nozzle mass collected across the manifold for the adjustable flow nozzle system.

Corresponding reference characters indicate corresponding elements among the view of the drawings. The headings used in the figures do not limit the scope of the claims.

DETAILED DESCRIPTION

Figure 1:
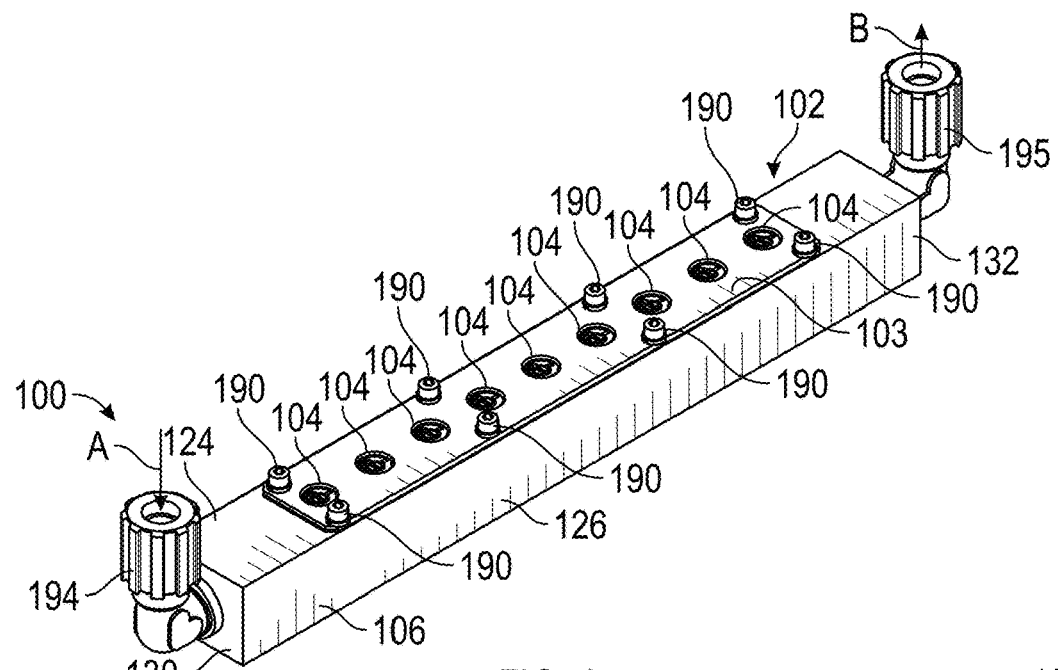
FIG. 1 is a perspective view of an adjustable flow nozzle system showing an adjustable flow manifold.
Figure 2:
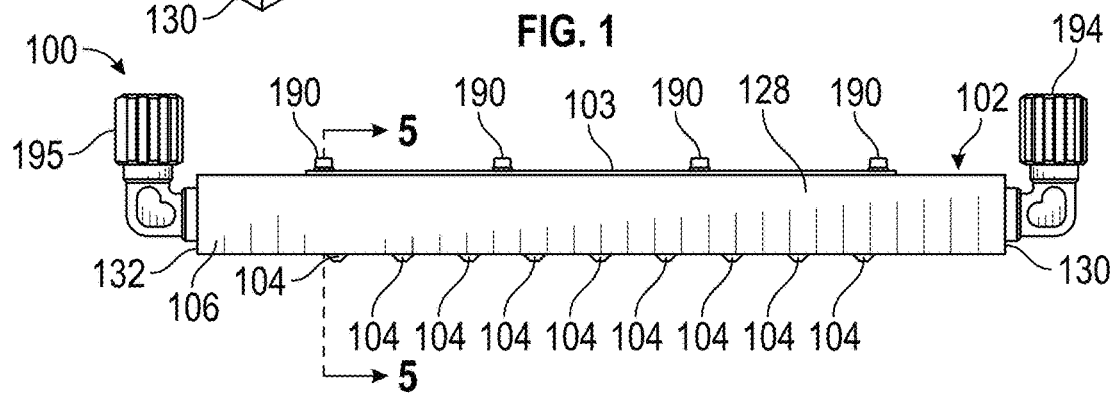
FIG. 2 is a side view of the adjustable flow manifold of FIG. 1.

Various embodiments for an adjustable flow nozzle system having one or more manifolds with each manifold having a plurality of adjustable flow nozzles in an array along a manifold body of each manifold in which the flow rate of each adjustable flow nozzle may be individually adjusted are described herein. In some embodiments, the adjustable flow nozzle system may be used for semiconductor processing through the spraying of various solvents or corrosive agents through a plurality of individually adjustable flow nozzles on a batch of silicon wafers at various flow rates within a process spray chamber. In some embodiments, each adjustable flow rate nozzle includes a stationary nozzle retainer defining an inlet opening in overlapping relation with a rotatable stem retainer that defines an inlet opening in which the overlapping inlet openings are rotated relative to each other along a common axis of rotation for defining an adjustable collective opening that controls the flow rate of fluid through the adjustable fluid nozzle. In some embodiments, adjusting the cross-sectional area of the collective opening as the stem retainer is rotated relative to the stationary nozzle retainer adjusts the flow rate through the adjustable flow nozzle. In some embodiments, the flow rate of each adjustable flow nozzle is adjusted through the selective overlap of the inlet openings such that each adjustable flow nozzle is adjustable between a no flow rate when no overlap occurs between the overlapped openings and a maximum flow rate when maximum overlap between the overlapped inlet openings occurs. In some embodiments, the flow rate of each adjustable flow nozzles along the manifold may be individually adjusted by engaging and rotating a restrictor adjuster coupled to the stem retainer that rotates the stem retainer and adjusts the cross-sectional area of the collective opening for each individual adjustable flow rate nozzle. Referring to the drawings, various embodiments of an adjustable flow nozzle system are illustrated and generally indicated as 100 in FIGS. 1-48.

Referring to FIGS. 1-5, the adjustable flow nozzle system 100 includes an adjustable flow manifold 102 having a plurality of adjustable flow nozzles 104 positioned in an array along a manifold body 106. In some embodiments, each of the adjustable flow nozzles 104 may be manually adjusted to a particular flow rate. In some embodiments, each adjustable flow nozzle 104 may be manually adjusted to adjust the flow rate of each adjustable flow nozzle 104 without requiring each adjustable flow nozzle 104 to be disassembled or require disengagement of the adjustable flow nozzle 104 from the manifold body 106 to adjust the flow rate as shall be discussed in greater detail below.

Figure 3:
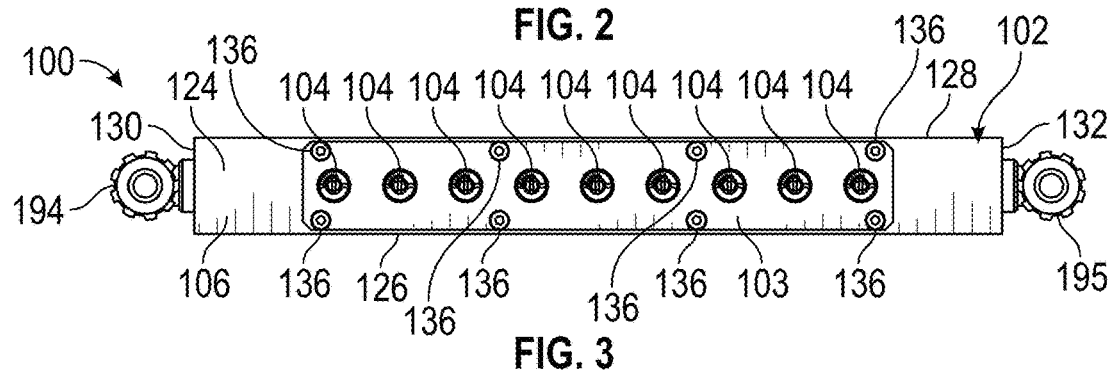
FIG. 3 is a top view of the adjustable flow manifold of FIG. 1.
Figure 4:
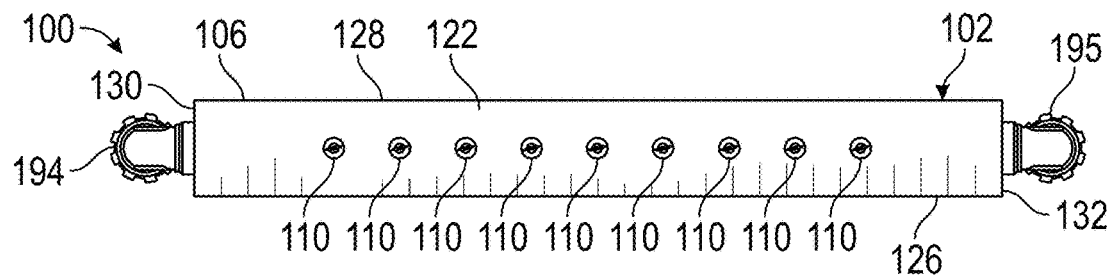
FIG. 4 is a bottom view of the adjustable flow manifold of FIG. 1.
Figure 5:
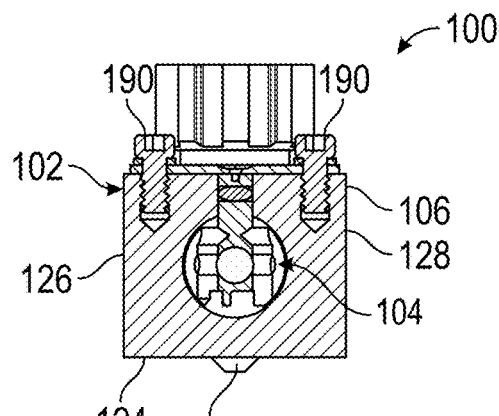
FIG. 5 is a cross-sectional end view of the adjustable flow manifold along line 5-5 of FIG. 2 showing one of a plurality of adjustable flow nozzles disposed within the adjustable flow manifold.
Figure 6:
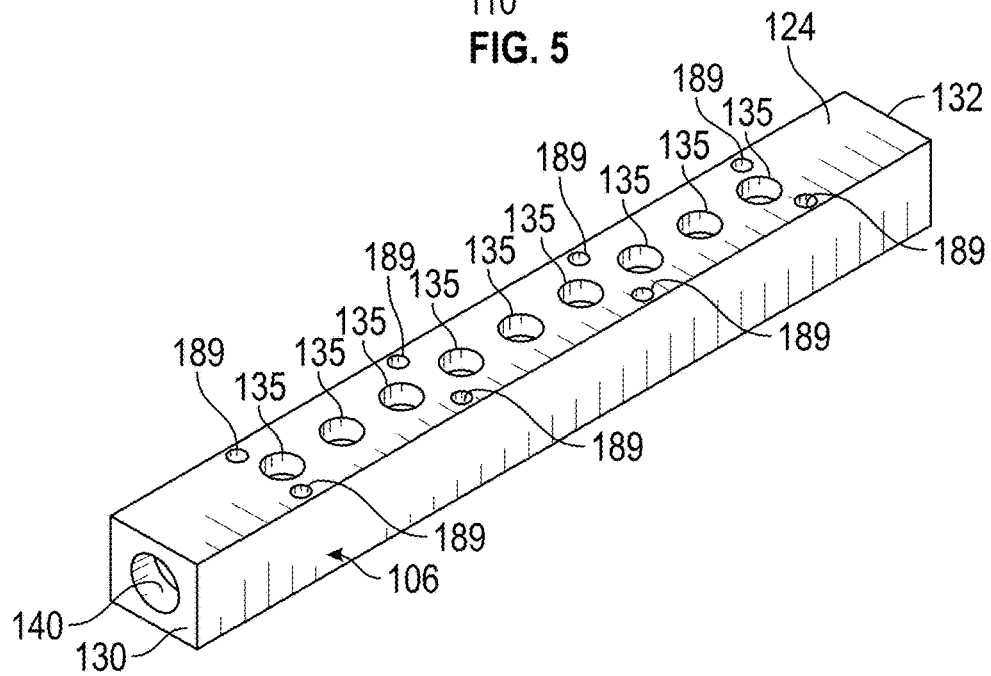
FIG. 6 is a perspective view of a manifold body for the adjustable flow manifold of FIG. 1.
Figure 7:
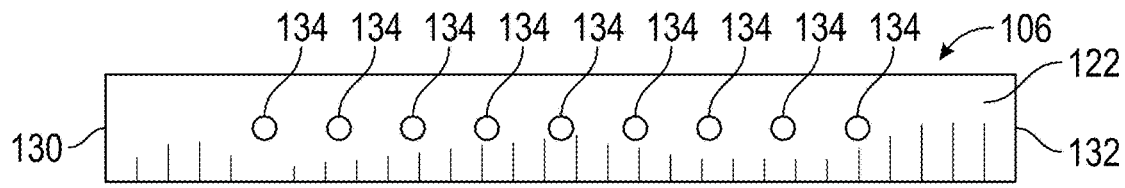
FIG. 7 is a bottom view of the manifold body of FIG. 6.
Figure 8:
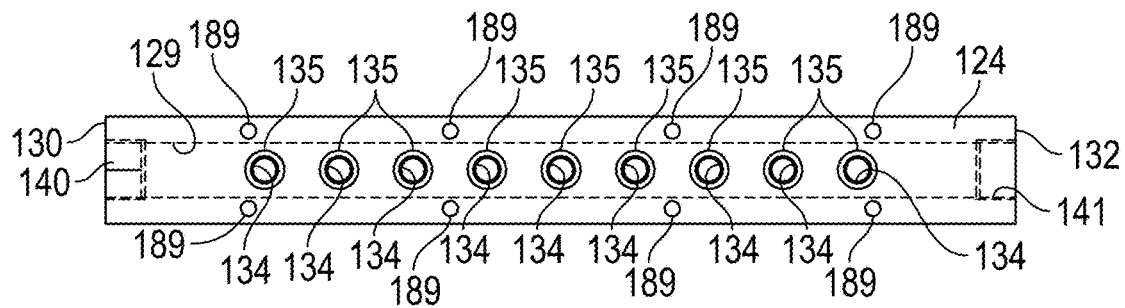
FIG. 8 is a top view of the manifold body of FIG. 6 showing the channel in broken line.

As shown in FIGS. 1-11, the manifold body 106 of manifold 102 is collectively defined by a top side 122, a bottom side 124, a front side 126 and rear side 128 forming a distal end portion 130 and an opposite proximal end portion 132 that collectively define the elongated rectangular-shaped manifold body 106. As shown in FIGS. 7-11, the manifold body 106 defines a plurality of access openings 134 arranged in series along the top side 122 of the manifold body 106 in communication with a channel 129 that extends the length of the manifold body 106. In some embodiments, each of the (FIGS. 8-10) plurality of access openings 134 is configured to allow a portion of a respective spray nozzle 110 of the adjustable spray nozzle 104 to extend outwardly from the manifold body 106 as illustrated in FIGS. 4 and 5.

Figure 9:
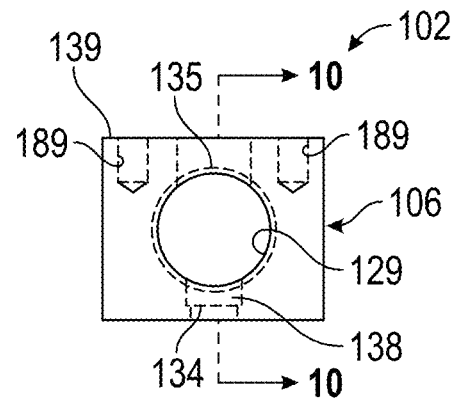
FIG. 9 is an end view of the manifold body of FIG. 6 showing the channel in broken line.
Figure 29:
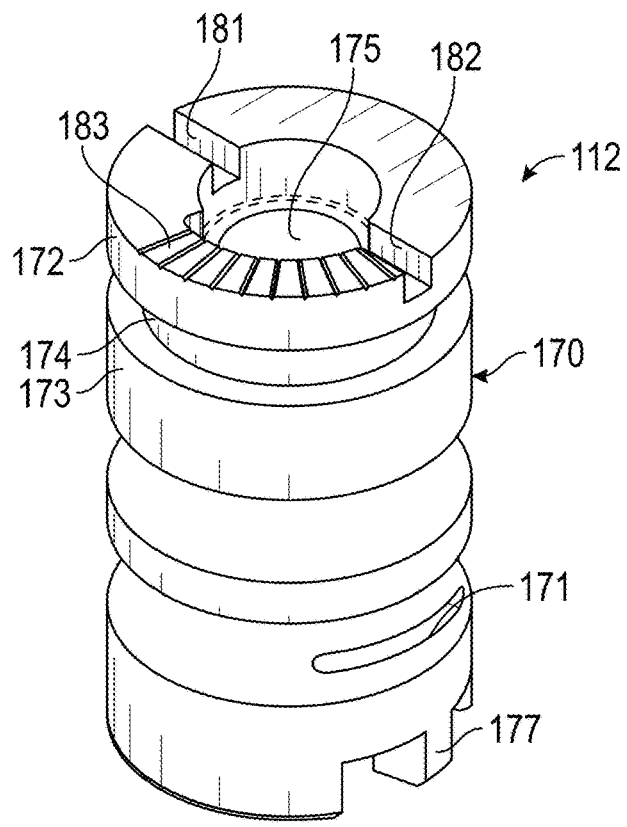
FIG. 29 is a perspective view of the nozzle retainer.
Figure 31:
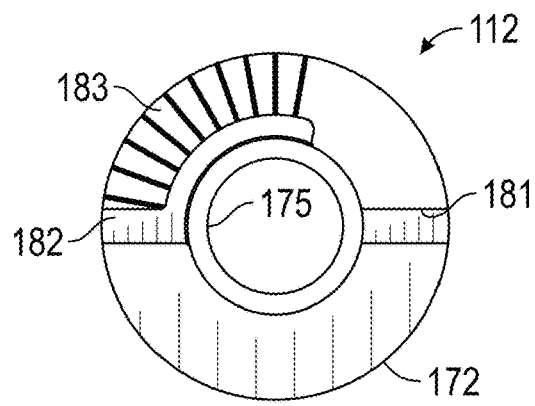
FIG. 31 is a top view of the nozzle retainer of FIG. 29.
Figure 32:
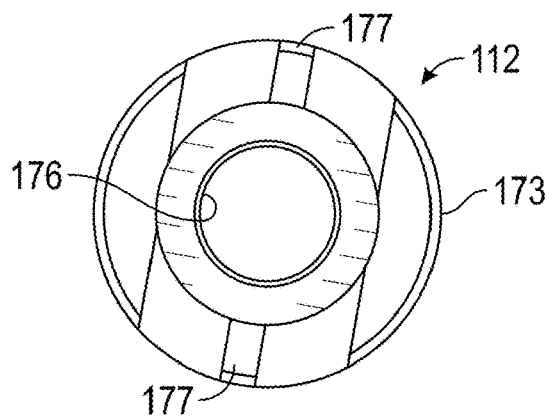
FIG. 32 is a bottom view of the nozzle retainer of FIG. 29.

As shown in FIGS. 6 and 8-10, the manifold body 106 further defines a plurality of apertures 135 arranged in series along the bottom side 124 of the manifold body 106 and configured to be engaged to a respective adjustable flow nozzle 104. In one arrangement, each aperture 135 is aligned along the bottom side 124 of the manifold body 106 with a respective access opening 134 aligned along the bottom side 124 so that an upper portion of the adjustable flow nozzle 104 extends outwardly from a respective aperture 135 and a lower portion of the adjustable flow nozzle 104 extends outwardly from a respective access opening 134 as illustrated in FIG. 9. As shown in FIG. 11, each access opening 134 communicates with a respective access cavity 139 and each aperture 135 communicates with a respective nozzle cavity 138. The nozzle cavity 138 is configured to receive a portion of the adjustable flow nozzle 104. In some embodiments, each respective access opening 134 is located directly opposite a respective aperture 135 such that the adjustable flow nozzle 104 may be accessed through the aperture 135 to manually adjust the flow rate of the adjustable flow nozzle 104. As shown in FIGS. 29 and 31, in some embodiments a plurality of adjustment markers 183 may be engraved or placed around the circumference of each respective nozzle retainer 112 to provide a visual indicator of flow rate for a user when manually adjusting the flow rate desired for each respective adjustable flow nozzle 104 as shall be described in greater detail below. In some embodiments, the adjustment markers 183 may be preset numbers, lines, visual indicators, structural markers, or a combination thereof which provide the user with a visual indication of flow rate being set for each respective adjustable flow nozzle 104.

Figure 10:
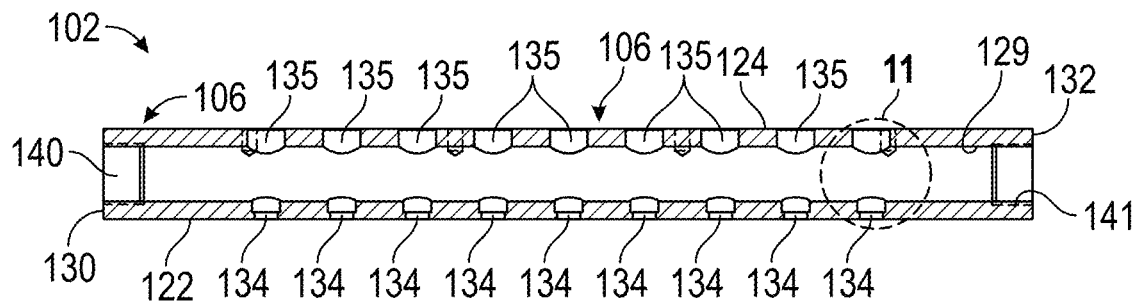
FIG. 10 is a cross-sectional view of the manifold body taken along line 10-10 of FIG. 9.
Figure 11:
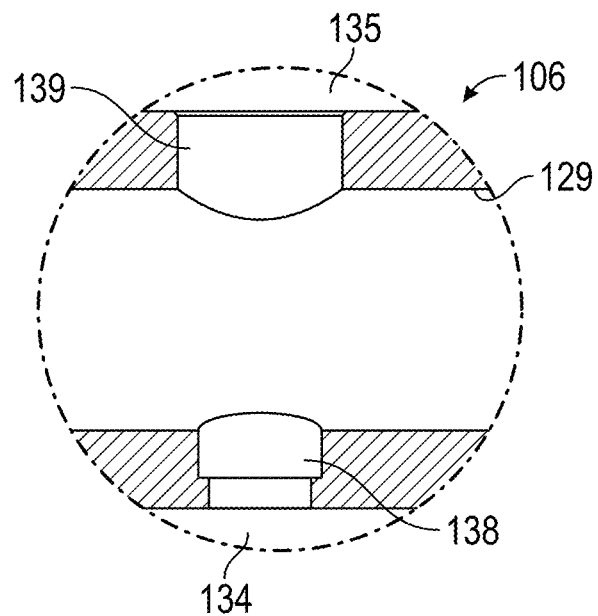
FIG. 11 is an enlarged cross-sectional view taken along line 11-11 of FIG. 10.
Figure 12:
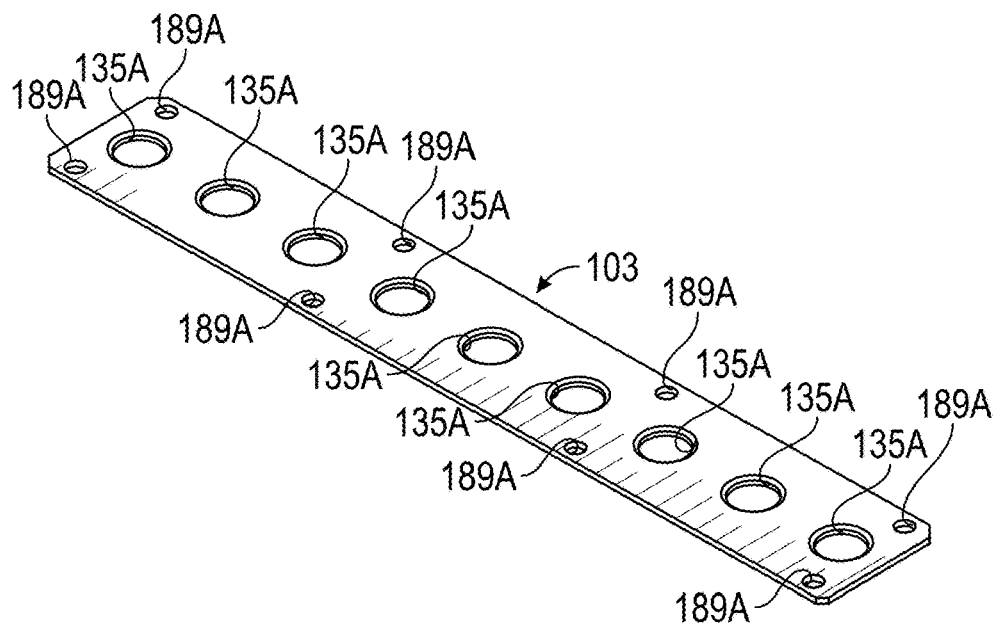
FIG. 12 is a perspective view of a top cover shown in FIG. 1.
Figure 13:
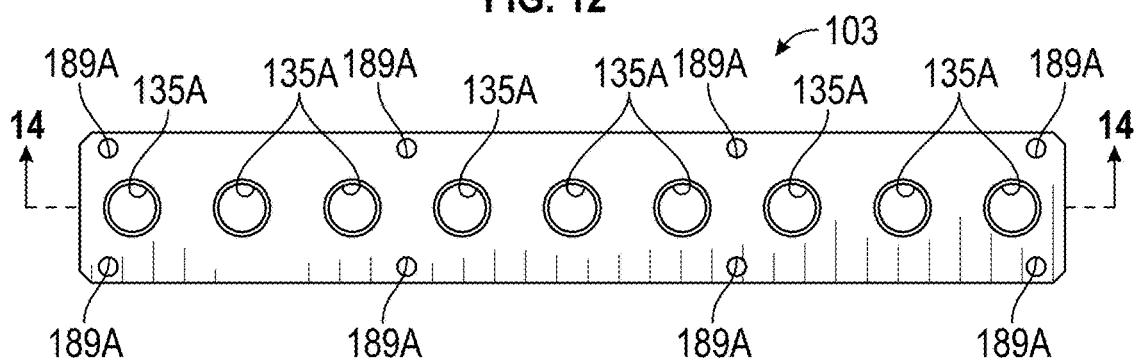
FIG. 13 is a top view of the top cover of FIG. 12.
Figure 14:
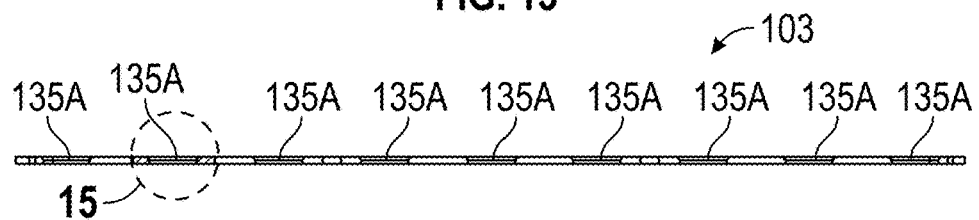
FIG. 14 is a cross-sectional view of the top cover taken along line 14-14 of FIG. 13.
Figure 15:
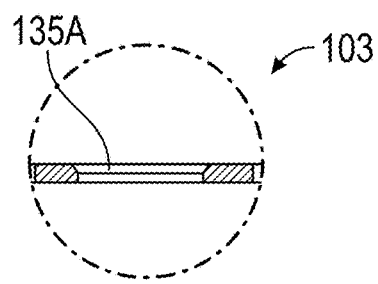
FIG. 15 is an enlarged cross-sectional view of the top cover of FIG. 14 showing one of a plurality of apertures defined along the top cover.
Figure 16:
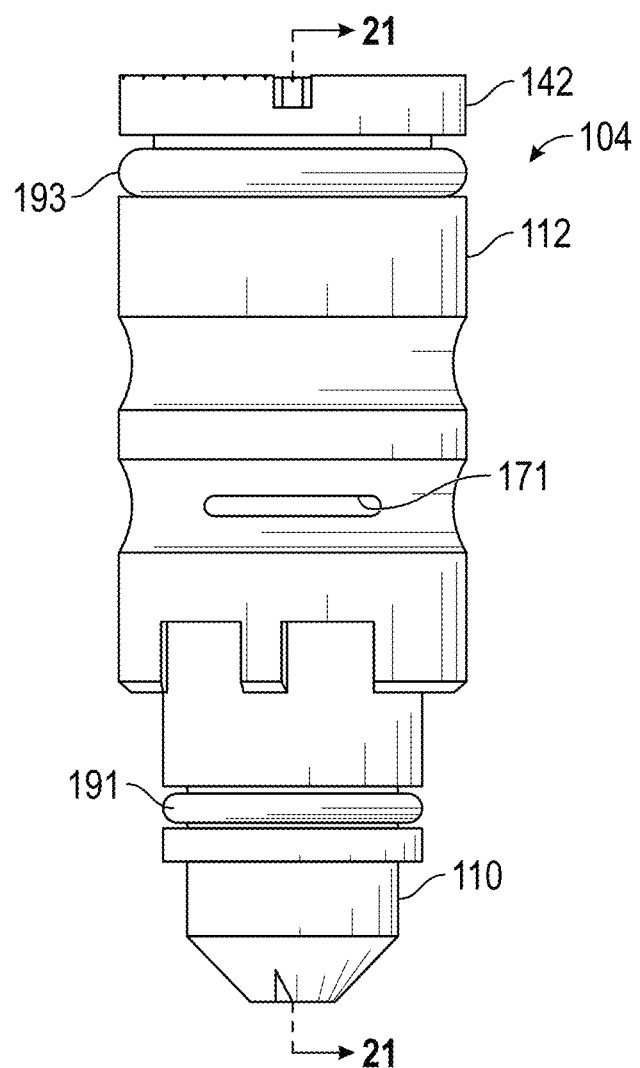
FIG. 16 is a side view of the adjustable flow nozzle.
Figure 17:
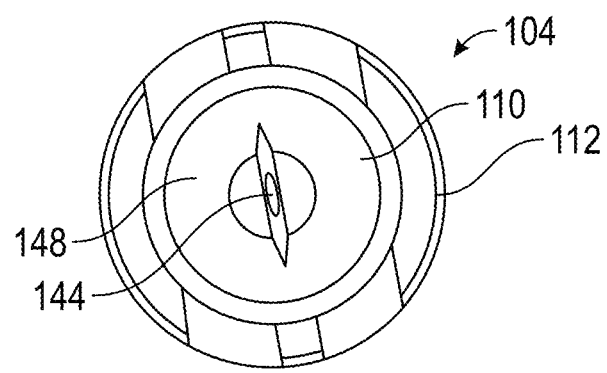
FIG. 17 is a bottom view of the adjustable flow nozzle of FIG. 16.
Figure 18:
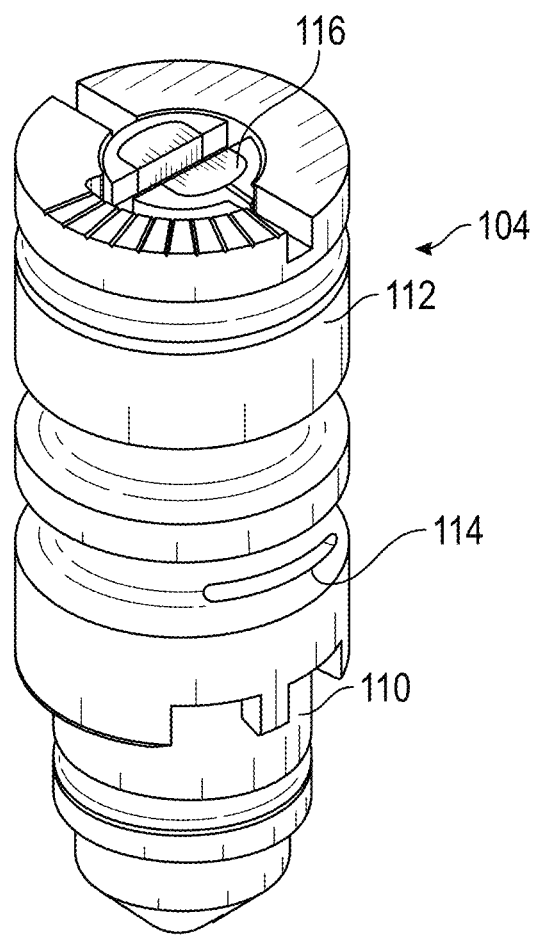
FIG. 18 is a perspective view of the adjustable flow nozzle of FIG. 16.
Figure 19:
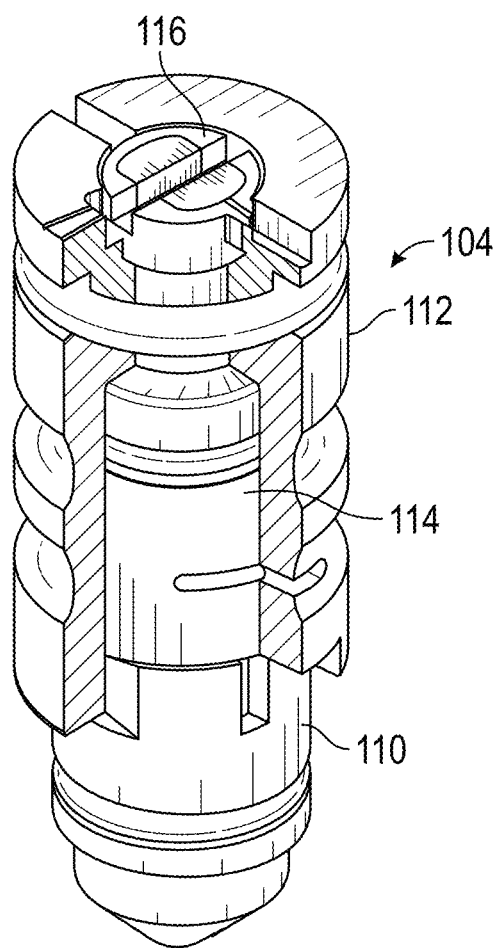
FIG. 19 is a partial cut-away perspective view of the adjustable flow nozzle of FIG. 16.
Figure 20:
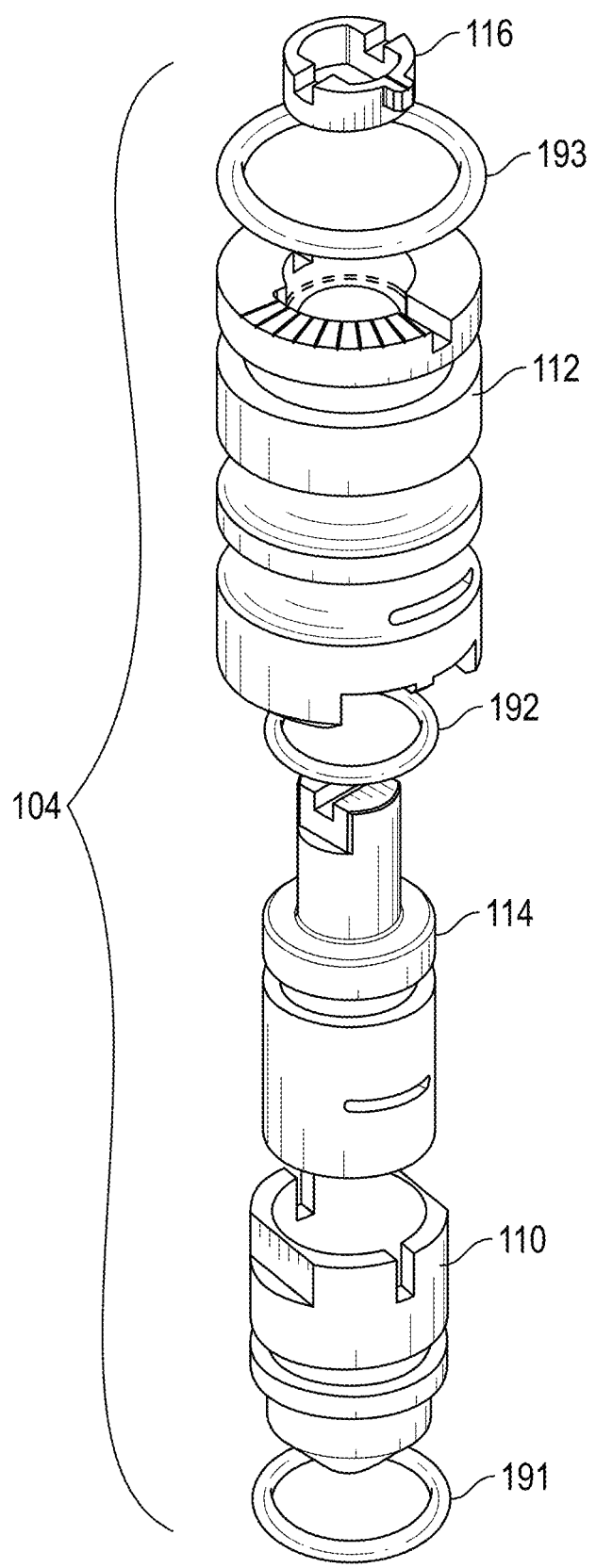
FIG. 20 is an exploded view of the adjustable flow nozzle of FIG. 16.

As further shown in FIG. 10, the proximal end portion 132 of the manifold body 106 defines a proximal opening 141 and the distal end portion 130 of the manifold body 106 defines a distal opening 140. As noted above, the manifold body 106 further defines an axial channel 129 in communication with the distal opening 140 at one end and proximal opening 141 at the opposite end of the axial the channel 129. As further noted above, each access opening 134 is configured to allow passage of the spray nozzle 110 of each adjustable flow nozzle 104 to extend outwardly from the manifold body 106, as shown in FIG. 5.

Referring to FIGS. 12-15, in some embodiments the manifold 102 may include a top cover 103 secured to the bottom side 124 of the manifold body 106 (FIG. 3). As shown, the top cover 103 defines a plurality of apertures 135A that are configured to align with a respective plurality of apertures 135 formed through the manifold body 106 when the top cover 103 is secured to the manifold body 106. Similarly, the top cover 103 defines a plurality of apertures 189A that are configured to align with a respective plurality of apertures 189 formed through the manifold body 106 when the top cover 103 is secured to the manifold body 106. As shown in FIG. 3, the plurality of aligned apertures 189 and 189A are each configured to receive a respective securing member 136, such as a screw, to secure the top cover 103 to the manifold body 106.

Referring back to FIGS. 1-5, one possible fluid pathway through the adjustable flow manifold 102 is illustrated. As shown, inlet flow A enters the axial channel 129 (FIG. 8) through the distal opening 140 formed by inlet 194 of the manifold body 106 and outlet flow B exits the opposite end of the axial channel 129 through the proximal opening 141 formed by the outlet 195 of the manifold body 106. In one aspect, each adjustable flow nozzle 104 may be manually adjusted to allow a respective outlet flow having the same or different flow rates.

As shown in FIGS. 16-21, in some embodiments each adjustable flow nozzle 104 includes a stem retainer 114 that is manually and individually adjusted to modify the cross-sectional area of a collective opening 133 (FIG. 21) defined by the overlapping cross-section formed by the inlet opening 153 of the stem retainer 114 and the inlet opening 171 (FIG. 16) of the stationary nozzle retainer 112 such that the current flow rate for that particular adjustable flow nozzle 104 may be changed to a desired flow rate by changing the overlapping cross-section between the inlet openings 153, 171 that define the collective opening 133. As such, each adjustable flow nozzle 104 can be individually adjusted to provide a flow rate that is either the same or different than the other adjustable flow nozzles 104 of the adjustable flow manifold 102 by the rotating the stem retainer 114 relative to the stationary nozzle retainer 112 to adjust the overlapping arrangement between the inlet openings 153, 171 as shall be discussed in greater detail below.

Referring to FIGS. 29-33, when the adjustable flow nozzle 104 is assembled the nozzle retainer 112 is fixed in position and engaged to the stem retainer 114 which is disposed within the nozzle retainer 112 and rotatable relative to the stationary nozzle retainer 112. In operation, the stem retainer 114 may be manually rotated using second adjustment key 166B (FIG. 45) to rotate the restrictor adjuster 116 to adjust flow rate of each respective adjustable flow nozzle 104, while first adjustment key 166A (FIG. 45) is engaged to the stationary nozzle retainer 112 for holding the nozzle retainer 112 in a stationary position as the restrictor adjuster 116 and stem retainer 114 are rotated together. As shown, each adjustable flow nozzle 104 includes a spray nozzle 110 which is engaged to the stem retainer 114 and functions as a nozzle arrangement for the release of fluid at a predetermined flow rate in a spraying action.

Figure 21:
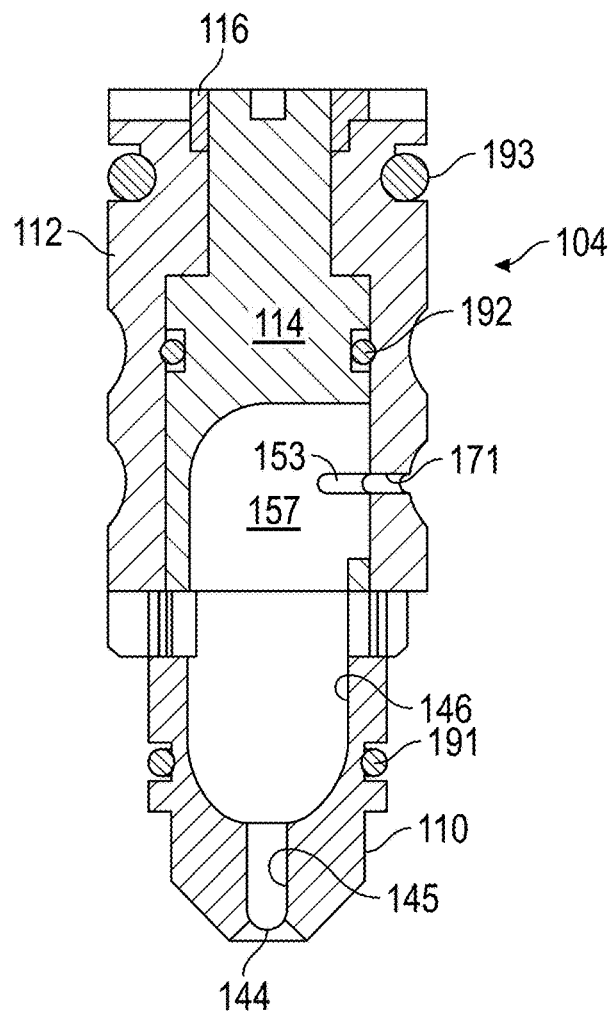
FIG. 21 is a cross-sectional view of the adjustable flow nozzle taken along line 21-21 of FIG. 16.
Figure 22:
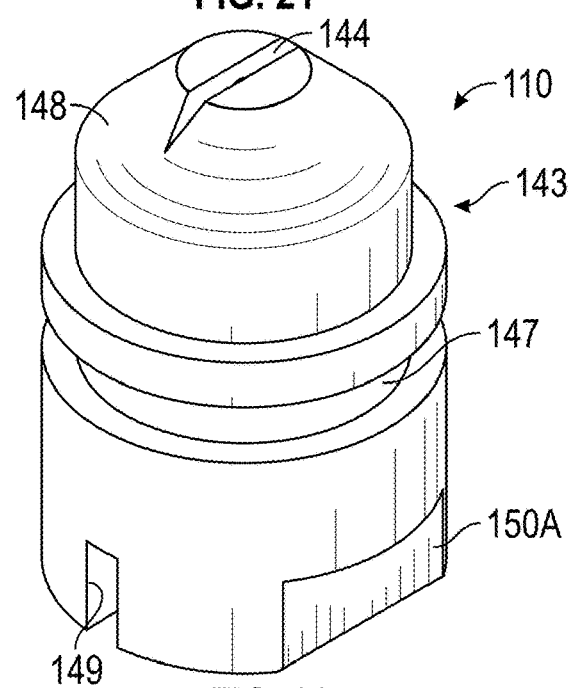
FIG. 22 is a perspective view of the spray nozzle.
Figure 23:
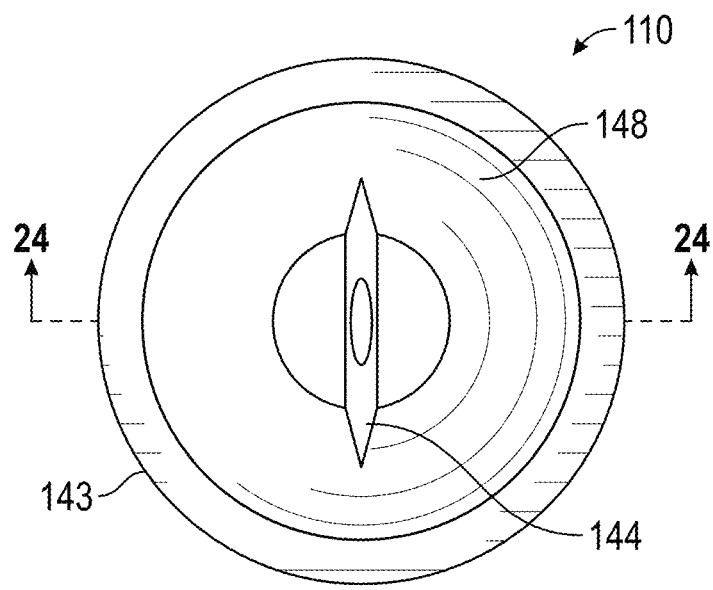
FIG. 23 is a bottom view of the spray nozzle of FIG. 22.
Figure 24:
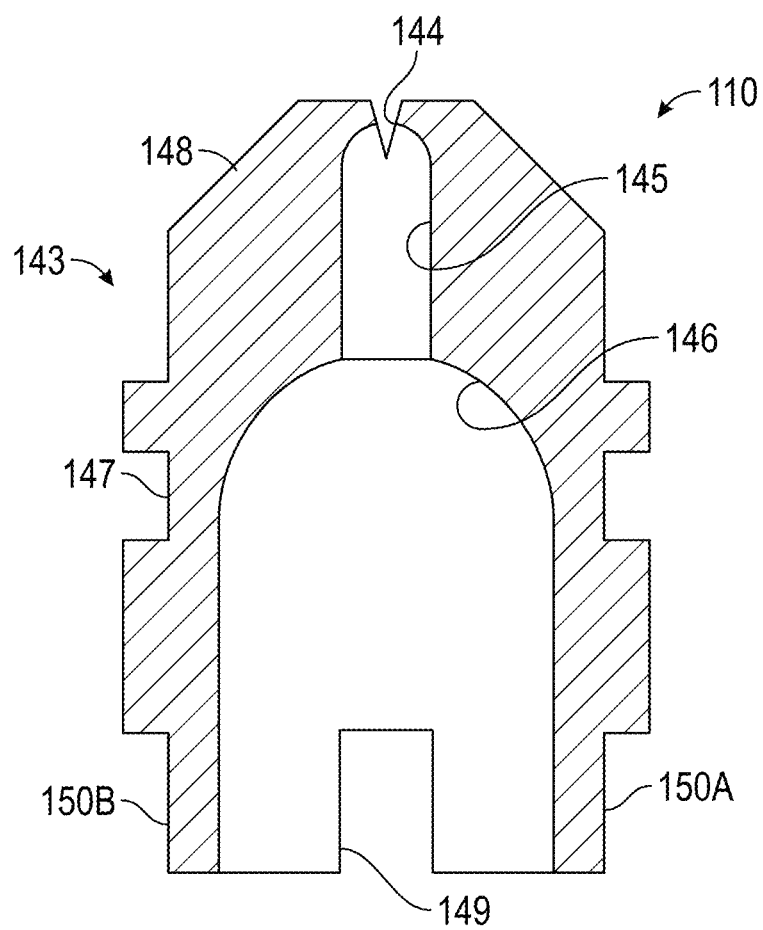
FIG. 24 is a cross-sectional view of the spray nozzle taken along line 24-24 of FIG. 23.
Figure 25:
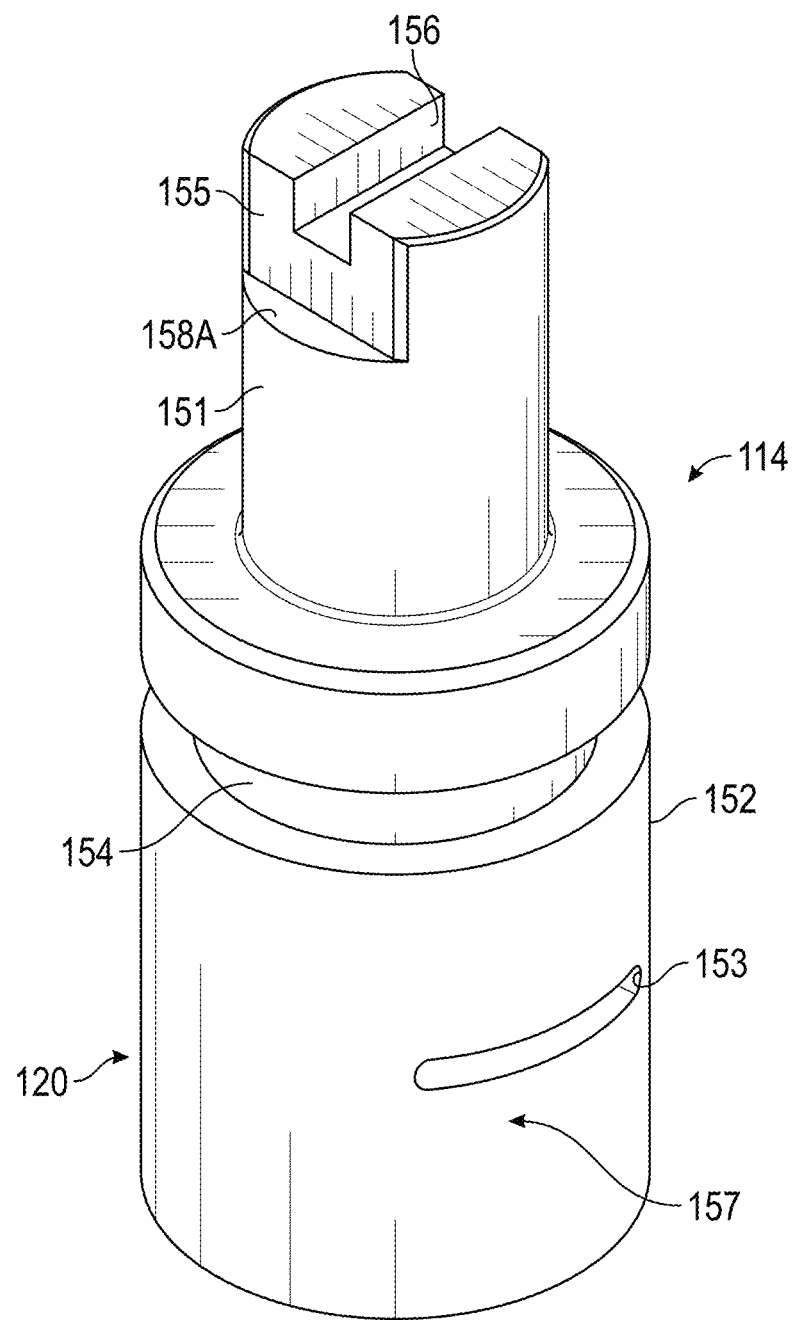
FIG. 25 is a perspective view of a stem retainer.
Figure 26:
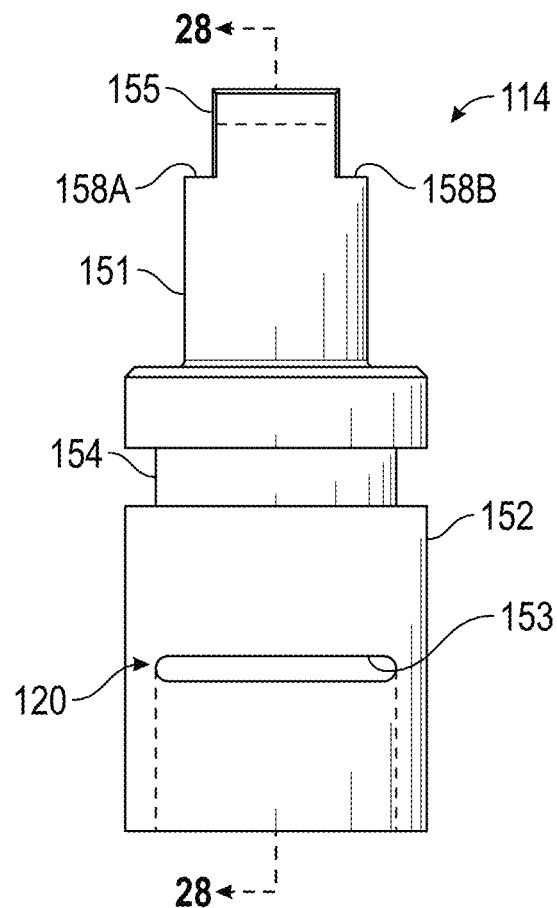
FIG. 26 is a side view of the stem retainer of FIG. 25 showing the interior chamber and slot in broken line.
Figure 27:
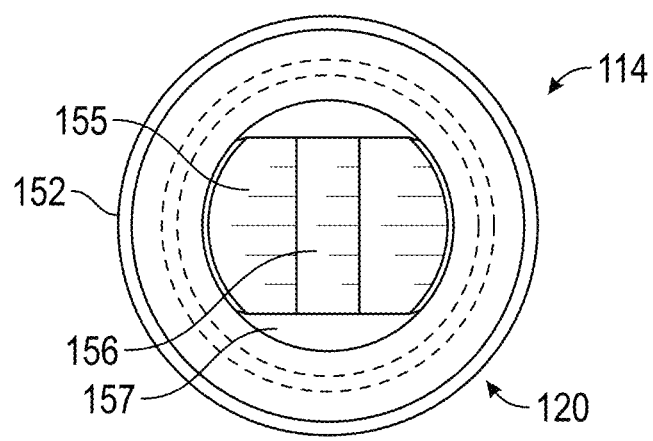
FIG. 27 is a bottom view of the stem retainer of FIG. 25.

As shown in FIGS. 22-24, in some embodiments the spray nozzle 110 includes a nozzle body 143 defining a nozzle head 148 forming a nozzle opening 144 configured to provide a spraying action. As shown in FIG. 21, the spray nozzle 110 also defines a nozzle conduit 146 defined through the nozzle body 143 and is in fluid flow communication with a nozzle channel 145 formed through the nozzle head 148 for establishing fluid flow communication with the nozzle opening 144 during the spraying action. In some embodiments, the nozzle body 143 forms an annular groove 147 configured to receive O-ring 191 to provide a fluid tight seal. As further shown in FIGS. 22 and 24, in some embodiments the nozzle body 143 may form a slot 149 between opposite flat portions 150A and 150B which are configured to engage the spray nozzle 110 to the nozzle retainer 112 when the adjustable flow nozzle 104 is assembled.

Figure 28:
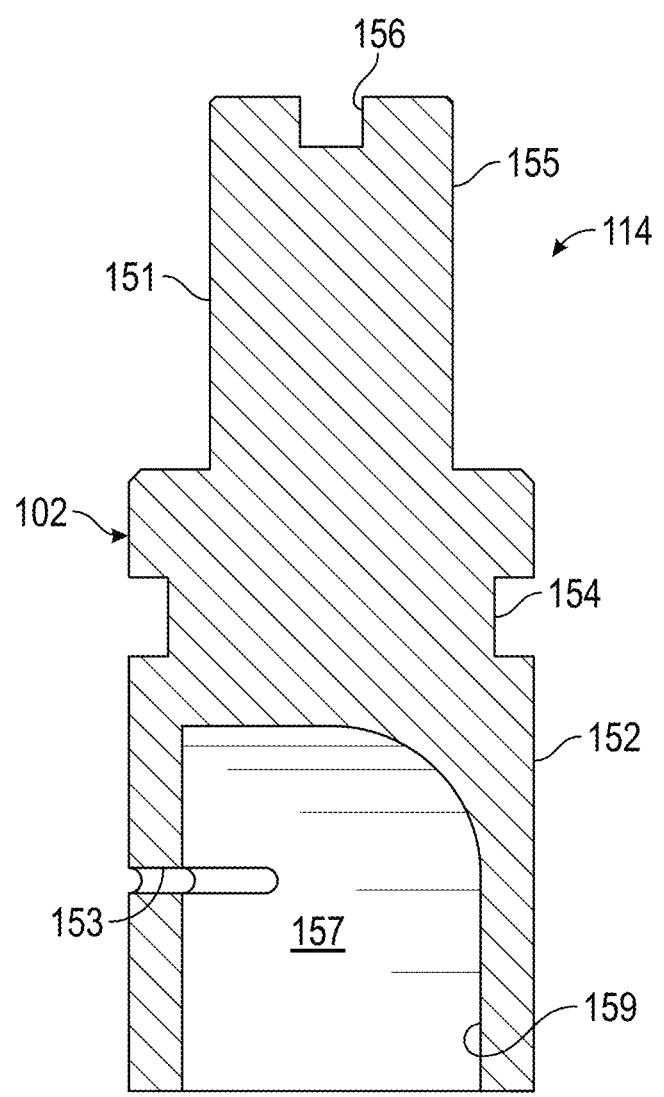
FIG. 28 is a cross-sectional view of the stem retainer taken along line 28-28 of FIG. 27.

As noted above, the stem retainer 114 is operable to gradually open or close fluid flow communication through an individual adjustable flow nozzle 104 when rotated by a second adjustment key 166B such that rotation of the restrictor adjuster 116 concurrently rotates the stem retainer 114 to adjust fluid flow as the stem retainer 114 is rotated relative to the stationary nozzle retainer 112. Referring to FIGS. 25-28, the stem retainer 114 includes a stem retainer body 120 defining a stem portion 151 and a body portion 152 with an annular groove 154 formed between the stem portion 151 and body portion 152 and is configured to receive an O-ring 192 (FIG. 20) to provide a fluid tight seal. As shown, the body portion 152 defines inlet opening 153 that communicates with an interior chamber 157 (FIG. 28) formed through the interior portion 152. As shown in FIG. 28, the internal chamber 157 communicates with an axial opening 159 to establish a fluid pathway through the stem retainer 114 between the nozzle retainer 112 and the spray nozzle 110 when fluid flow communication is established at a predetermined flow rate. As further shown in FIGS. 25 and 26, the stem portion 151 of the stem retainer 114 defines a mounting portion 155 having a first abutment shoulder 158A formed opposite a second abutment shoulder 158B with a slot 156 defined laterally between the first and second abutment shoulders 158A and 158B. In one arrangement, the slot 156, the first abutment shoulder 158A, and the second abutment shoulder 158B collectively define a mounting structure for engaging restrictor adjuster 116. The restrictor adjuster 116 is operable to adjust fluid flow rate through the adjustable flow nozzle 104 when rotated by second adjustment key 166B such that rotation of the restrictor adjuster 116 (FIGS. 18-21) concurrently rotates the stem retainer 114 for changing the overlapping arrangement of the first inlet opening 153 of the stem retainer 114 relative to the second inlet opening 171 that forms the collective opening 133.

Figure 30:
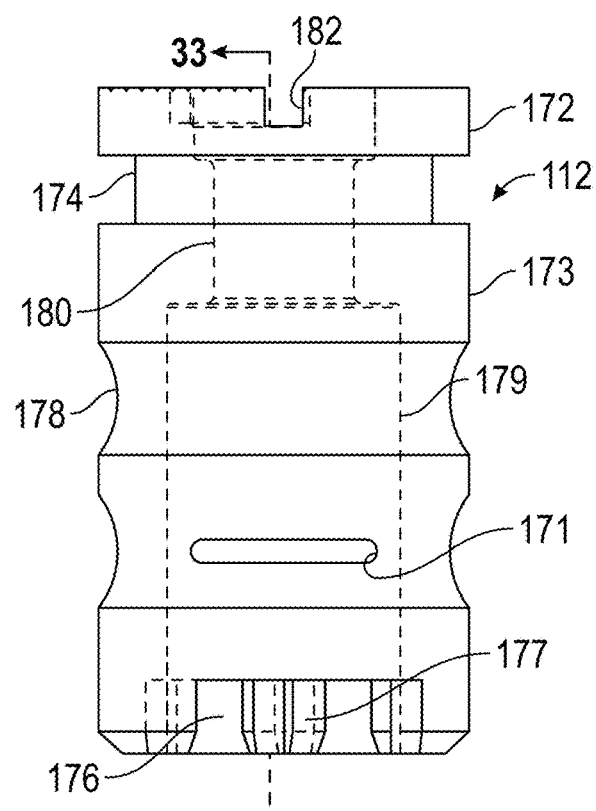
FIG. 30 is a side view of the nozzle retainer of FIG. 29 showing the upper and lower chambers in broken line.
Figure 33:
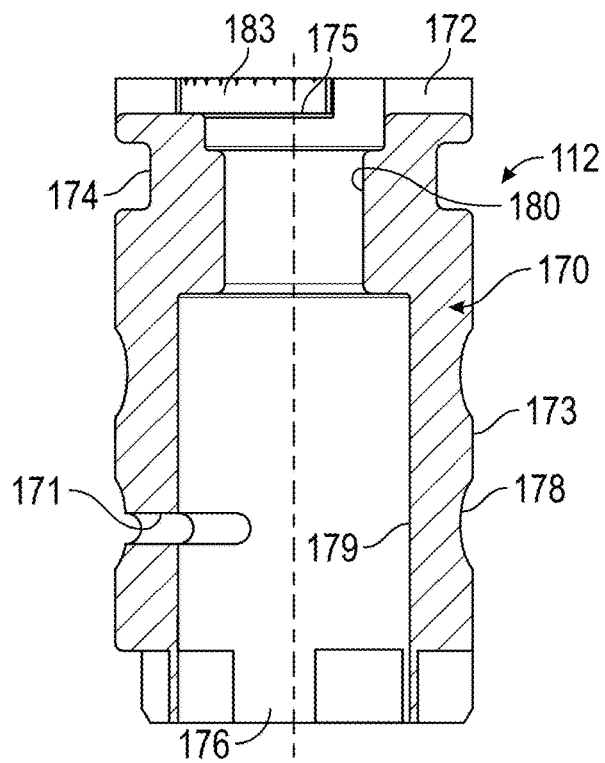
FIG. 33 is a cross-sectional view of the nozzle retainer taken along line 33-33 of FIG. 30.

Referring to FIGS. 29-33, in some embodiments the nozzle retainer 112 has a generally cylindrically-shaped nozzle retainer body 170 forming a main body portion 173 having a scalloped surface 178 and a cap portion 172 forming an annular groove 174 between the cap portion 172 and main body portion 173 configured to receive an O-ring 193 (FIG. 20) that provides a fluid tight seal. As shown, the main body portion 173 defines inlet opening 171 formed through the main body portion 173 that communicates with lower chamber 179 formed through the nozzle retainer body 170. As shown in FIG. 30, lower chamber 179 also communicates with an upper chamber 180 adjacent an upper axial opening 175 formed through cap portion 172. In some embodiments, a lower axial opening 176 (FIG. 33) is formed through the lower portion of the nozzle retainer body 170 and communicates with the lower chamber 179. As shown in FIGS. 29-31, the main body portion 173 defines a plurality of legs 177 and in some embodiments a plurality of adjustment markers 183 (FIG. 31) are aligned circumferentially around the cap portion 172 to indicate desired flow rate. As shown in FIGS. 30 and 33, the upper and lower chambers 179, 180 are collectively configured to receive the stem retainer 114 within the nozzle retainer 112 when the adjustable flow nozzle 104 is assembled. In some embodiments, the cap portion 172 forms opposing first and second slots 181 and 182 formed across the upper axial opening 175 with slot 182 formed adjacent one end of the plurality of markers 183.

Figure 34:
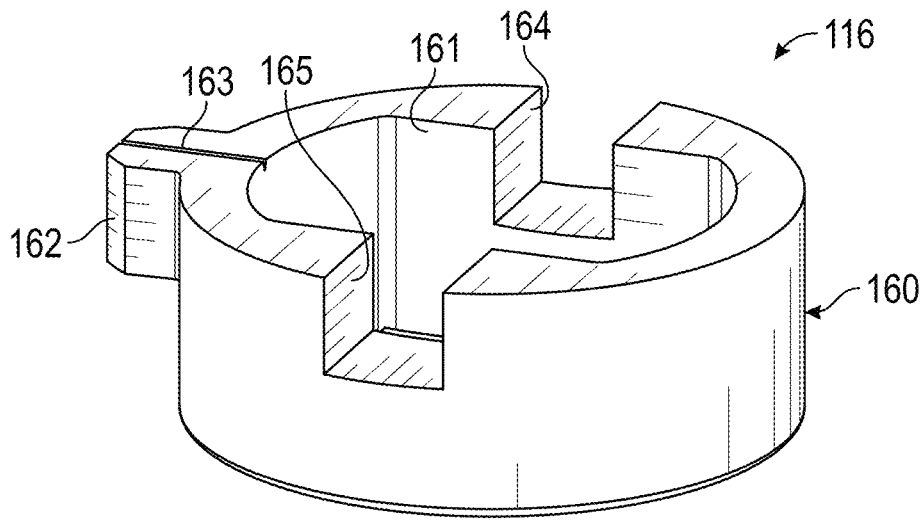
FIG. 34 is a perspective view of a restrictor adjuster.
Figure 35:
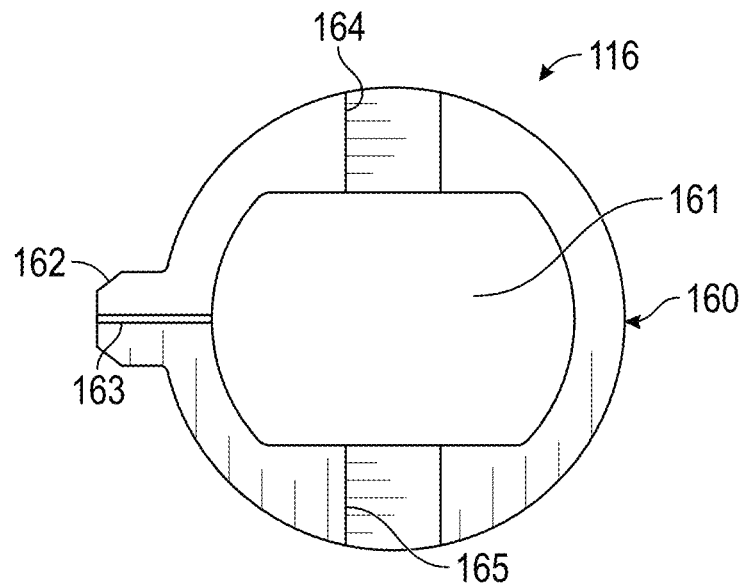
FIG. 35 is a top view of the restrictor adjuster of FIG. 34.
Figure 36:
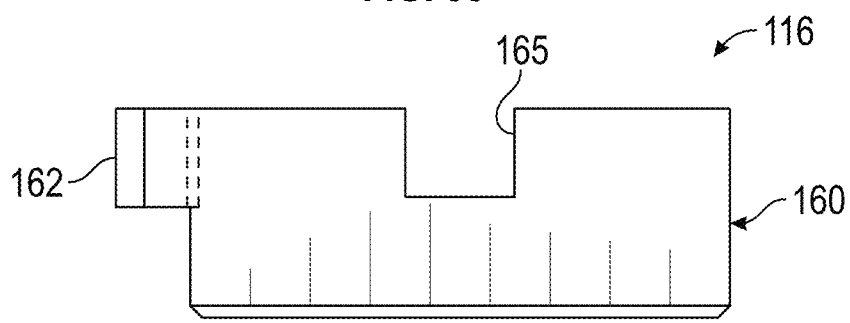
FIG. 36 is a side view of the restrictor adjuster of FIG. 34.
Figure 37:
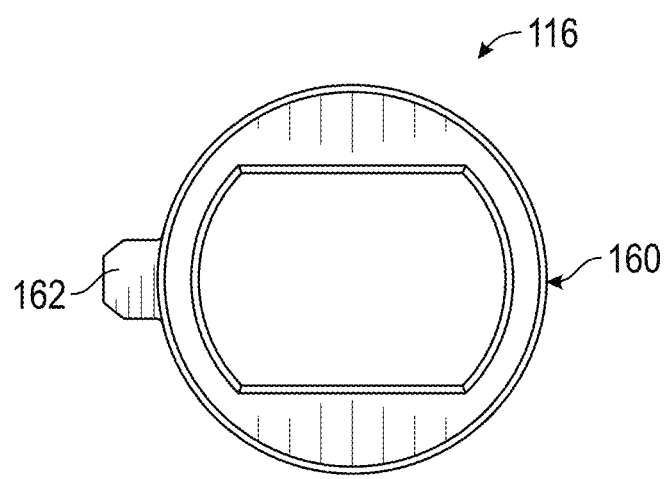
FIG. 37 is a bottom view of the restrictor adjuster of FIG. 34.
Figure 38:
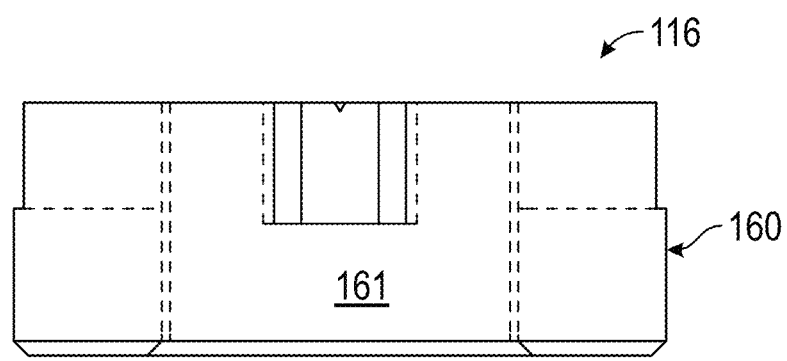
FIG. 38 is an end view of the restrictor adjuster of FIG. 34.
Figure 39:
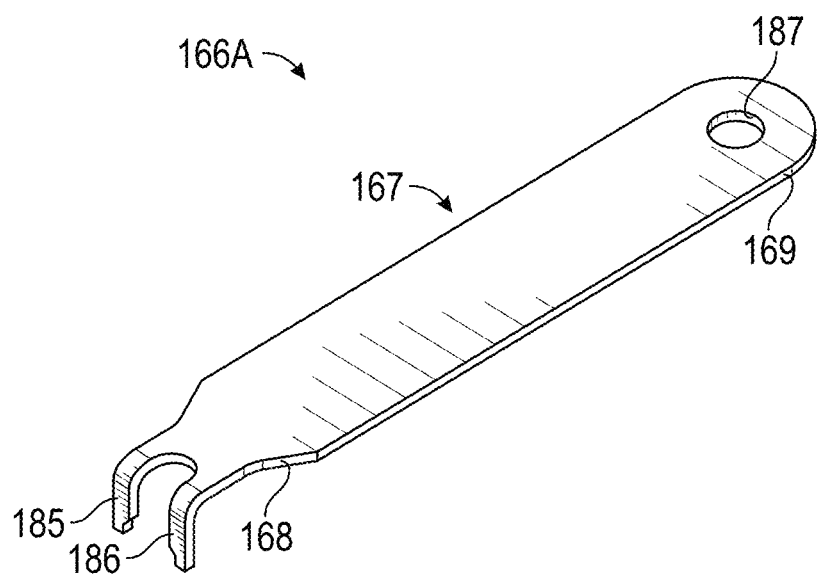
FIG. 39 is a perspective view of an adjustment key used to hold the nozzle retainer in a stationary position while turning the stem retainer and restrictor adjuster together.
Figure 40:
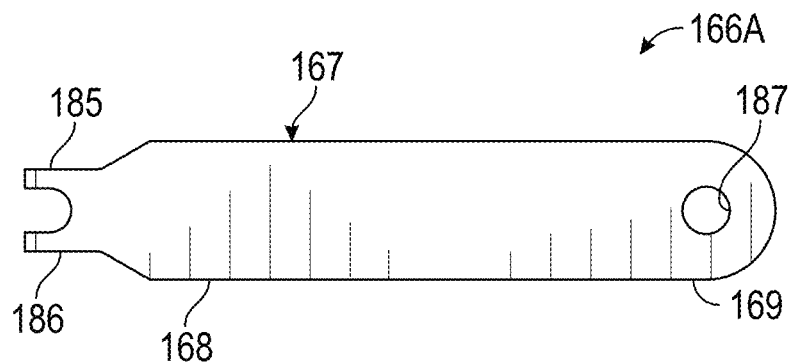
FIG. 40 is a bottom view of the adjustment key of FIG. 39.
Figure 41:
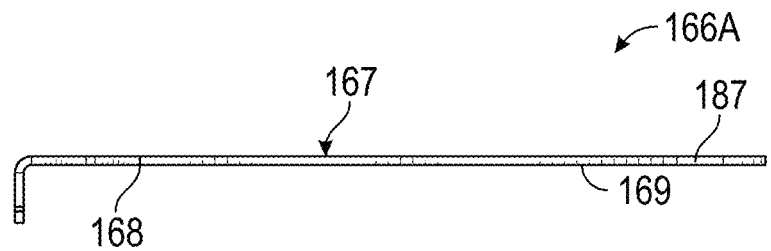
FIG. 41 is a side view of the adjustment key of FIG. 39.
Figure 42:
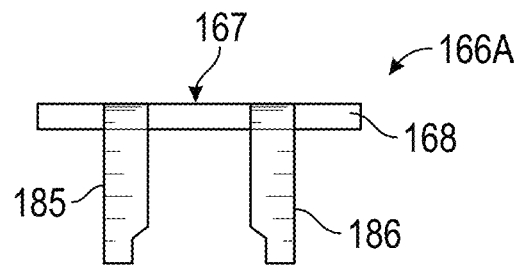
FIG. 42 is an end view of the adjustment key of FIG. 39.
Figure 43:
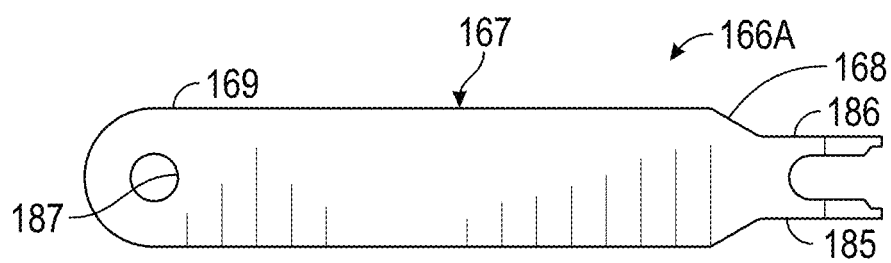
FIG. 43 is a top view of the adjustment key of FIG. 39 showing the protrusions in a flat configuration.

Referring to FIGS. 34-38, 45 and 46, as noted above the flow rate of the adjustable flow nozzle 104 may be adjusted by rotating the restrictor adjuster 116 coupled to the stem retainer 114 using a second adjustment key 166B in the rotational direction indicated by the adjustment markers 183 (FIG. 29) as the first adjustment key 166A engaged to the nozzle retainer 112 to maintain the nozzle retainer 112 in a stationary position as the stem retainer 114 and restrictor adjuster 116 are rotated together by the second adjustment key 166B. In some embodiments, the restrictor adjuster 116 defines a generally circular-shaped restrictor body 160 defining a cavity 161 (FIGS. 34 and 35) in communication with opposing first and second slots 164 and 165 formed on opposite sides of cavity 161. As shown in FIGS. 34 and 35, the restrictor body 160 forms a lateral extension 162 having an indicator line 163 that may point to any one of the adjustment markers 183 for indicating the desired flow rate of a respective adjustable flow nozzle 104.

Figure 46:
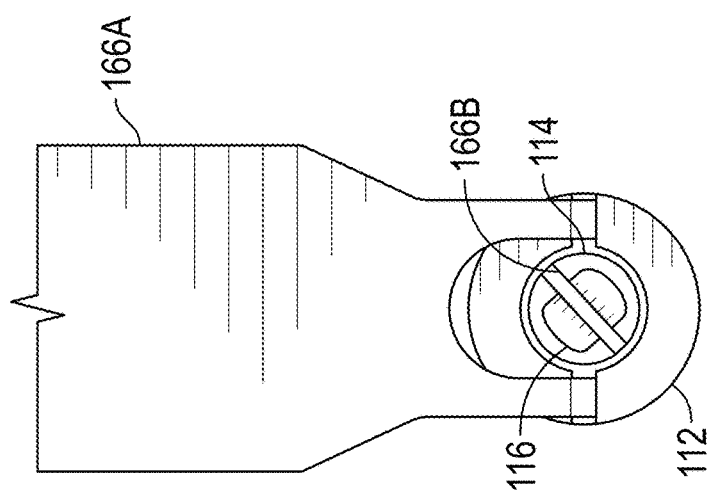
FIG. 46 is a top view of the first adjustment key coupled to hold the nozzle retainer in a stationary position and the second adjustment key coupled to concurrently rotate the restrictor adjuster and stem retainer.
Figure 45:
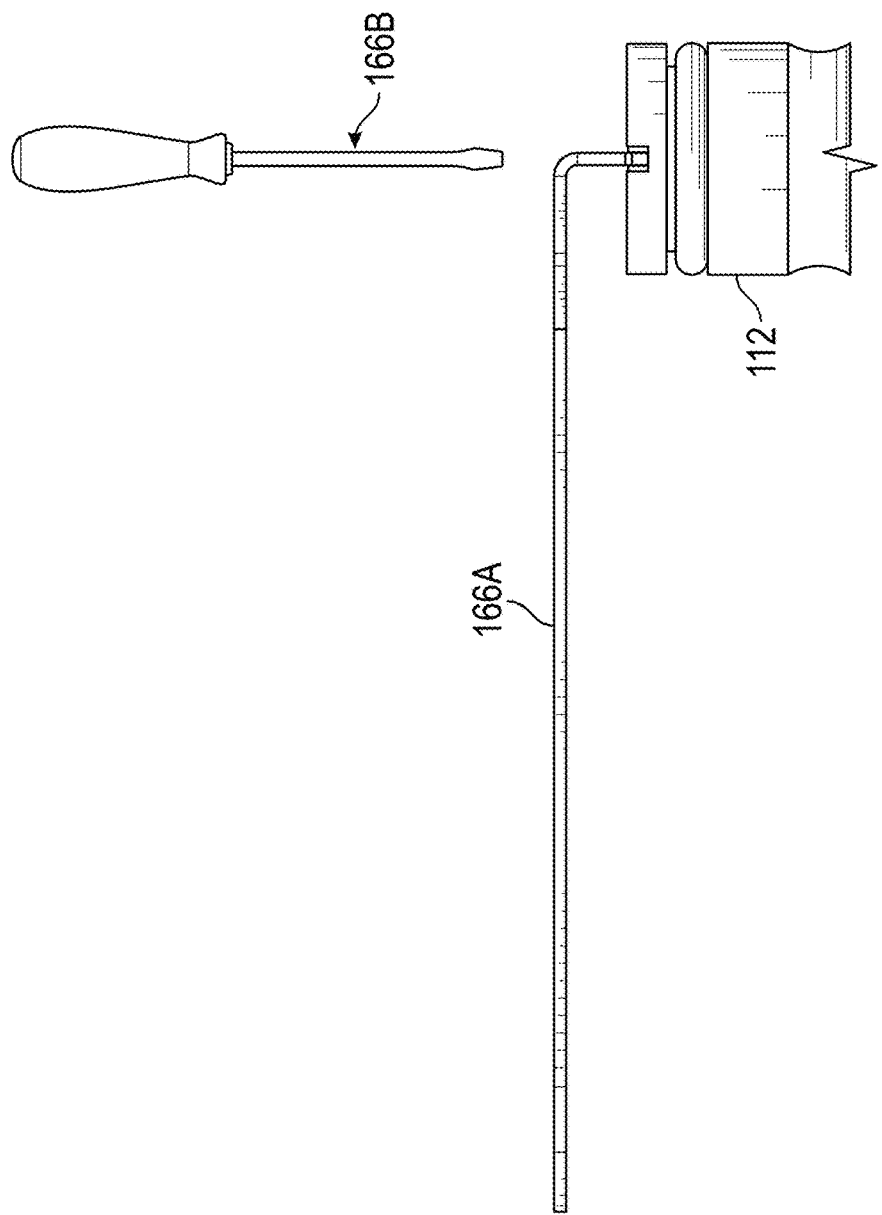
FIG. 45 is a side view of the first adjustment key coupled to the nozzle retainer and the second adjustment key prior to engagement with the restrictor adjuster.

Referring to FIGS. 39-43, 45 and 46 in some embodiments, first adjustment key 166A may is used to maintain the nozzle retainer 112 in a stationary position and includes an elongated key body 167 defining a distal portion 168 and a proximal portion 169 that is of sufficient length to allow the distal portion 168 to access the adjustable flow nozzle 104. In some embodiments, first and second key elements 185 and 186 extend from the distal portion 168 of the elongated key body 167 of the first adjustment key 166A which are configured to engage and maintain the nozzle retainer 112 in a stationary position as the stem retainer 114 and adjuster 116 are rotated together by second adjustment key 166B (FIGS. 45 and 46). In some embodiments, the second adjustment key 166B may be a screw driver, although the second adjustment key 1668 is not limited to a screw driver and may be any adjustment tool configured to engage and rotate the restrictor adjuster 116. As shown, the proximal portion 169 of the first adjustment key 166A may be configured to define an opening 187.

Figures 44A, 44B:
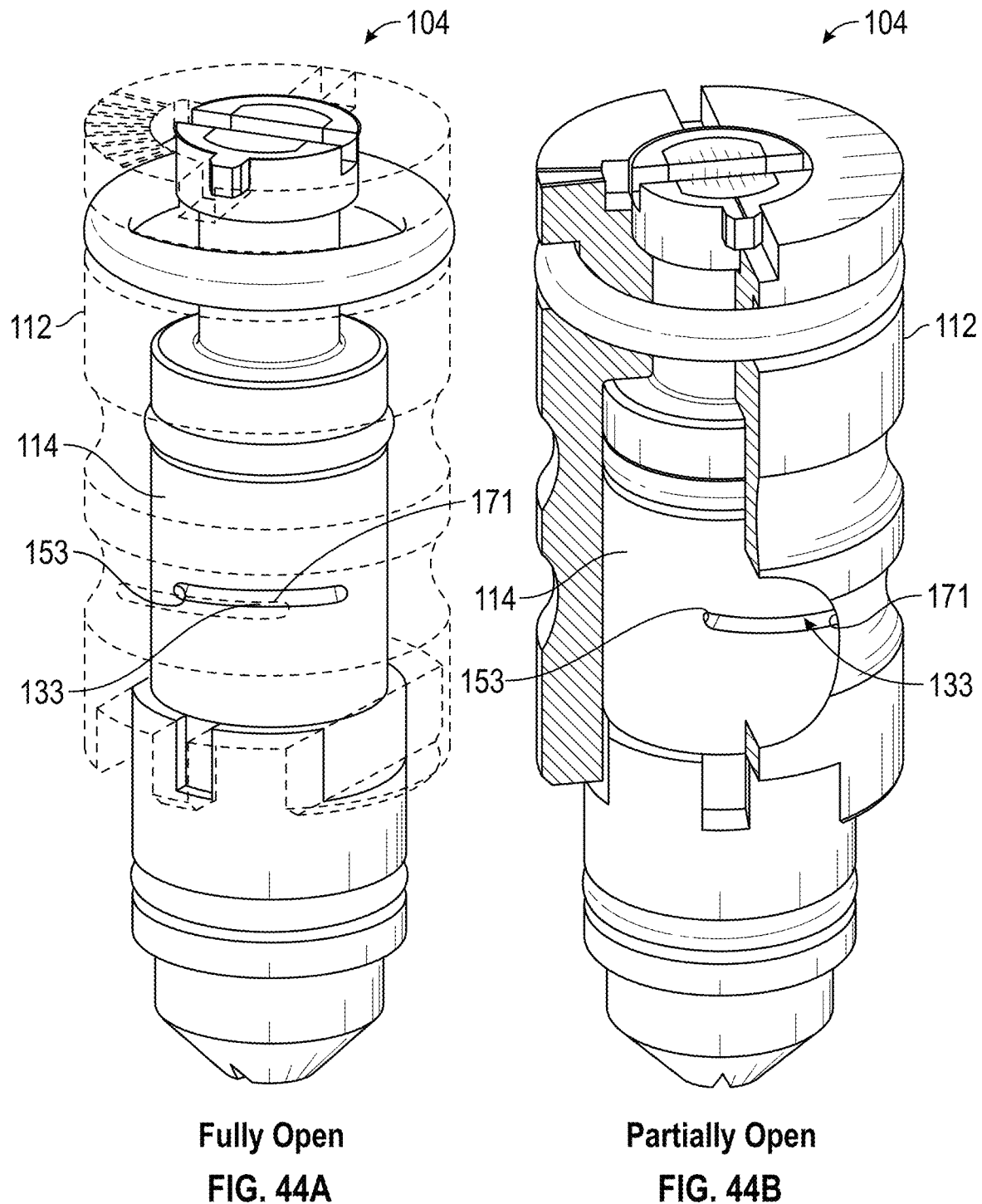
FIGS. 44A-44D are perspective sequence views showing the adjustable flow nozzle in a fully open position (FIG. 44A), partially open position (FIG. 44B), partially closed position (FIG. 44C), and fully closed position (FIG. 44D).
Figures 44C, 44D:
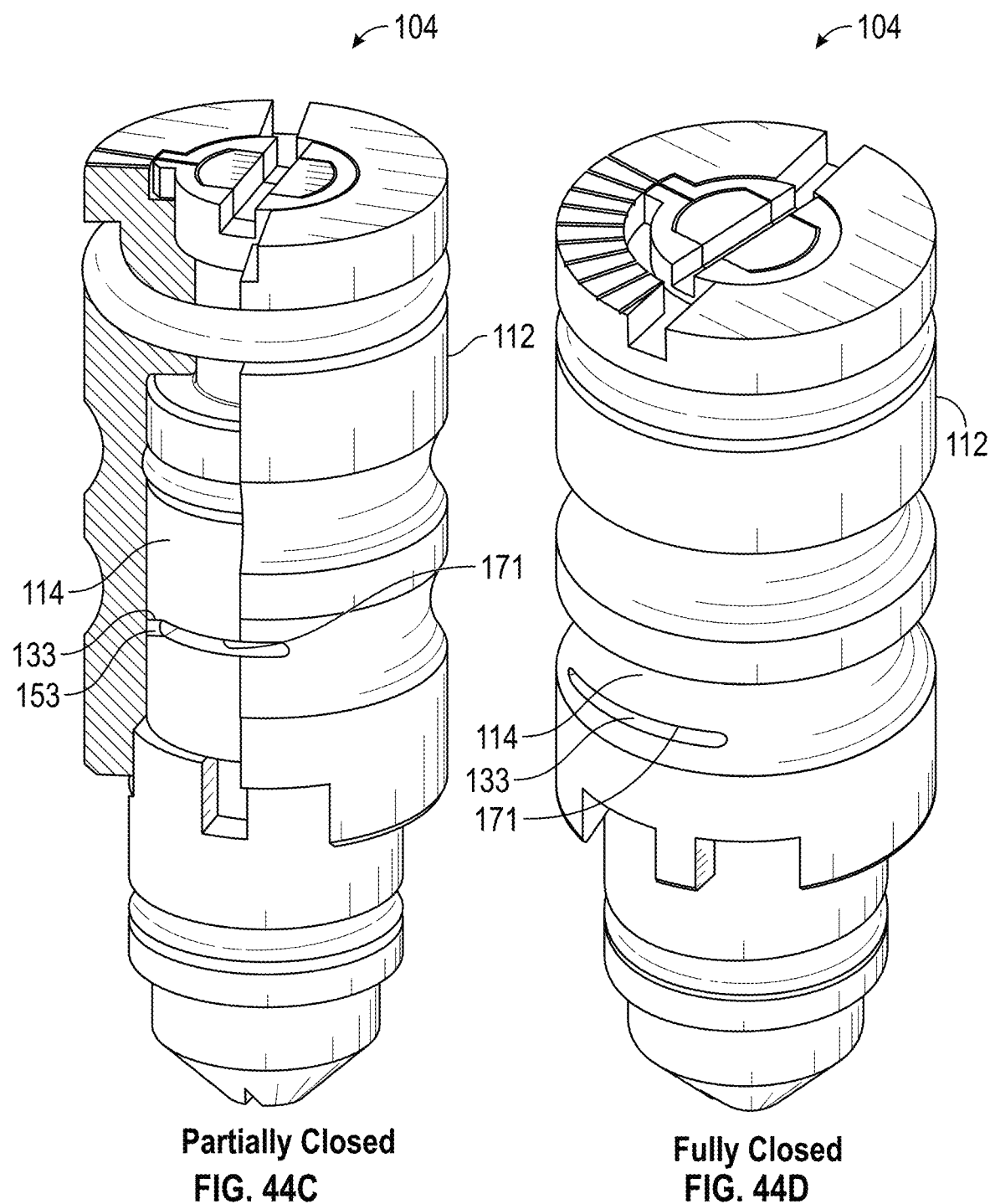

FIGS. 44A-44D illustrate a sequence of operation for the adjustable flow nozzle 104 as the stem retainer 114 is rotated relative to the stationary nozzle retainer 112 as the first key element 166A (FIG. 46) engages the nozzle retainer 112, while the second key 166B, for example a screw driver, is engaged to turn the adjuster 116 and rotate the stem retainer 114 to individually change the flow rate of each of the respective adjustable flow nozzles 104 along the adjustable flow manifold 102. Referring to FIG. 44A, the adjustable flow nozzle 104 is shown in the fully open position wherein the stem retainer 114 is rotated such that the inlet opening 153 of the stem retainer 114 is fully or substantially overlapped with the inlet opening 171 of the stationary nozzle retainer 112 to collectively form a fully open collective opening 133 having maximum flow rate capacity. Referring to FIG. 44B, the adjustable flow nozzle 104 is shown in the partially open position wherein the stem retainer 114 has been rotated such that the inlet opening 153 of the stem retainer 114 rotates slightly out of position relative to the inlet opening 171 of the stationary nozzle retainer 112 to collectively form a partially open collective opening 133 having a lower than maximum flow rate. Referring to FIG. 44C, the adjustable flow nozzle 104 is shown in the partially closed position wherein the stem retainer 114 has been further rotated in the same direction such that the inlet opening 153 of the stem retainer 114 has been rotated even more out of position relative to the inlet opening 171 of the stationary nozzle retainer 112 to collectively form a partially closed collective opening 133 having a lower flow rate than the collective opening 133 shown in FIG. 44B. Referring to FIG. 44D, the adjustable flow nozzle is shown in the fully closed position wherein the stem retainer 114 has been rotated to the maximum rotational position such that the inlet opening 153 of the stem retainer 114 has been rotated fully out of position relative to the inlet opening 171 of the stationary nozzle retainer 112 to form a fully closed collective opening 133 having a zero minimum flow rate.

In some embodiments, the overlapping inlet openings 153 and 171 that form the collective opening 133 may be slotted elongated openings; however, in other embodiments the overlapping inlet openings 153 and 171 of the stem retainer 114 and nozzle retainer 112, respectively, may be other shapes and sizes, such as a circular-shaped opening, an oval-shaped opening, a square-shaped opening, a rectangular-shaped opening, a symmetrically-shaped opening, and/or an asymmetrically-shaped opening. In one aspect, the overlapping inlet openings 153 and 171 may be designed to effectuate whatever granularity or flow response is required to achieve flow performance through the spray nozzles 110.

In some embodiments, the components of the adjustable flow nozzles 104 are selected to have the proper chemical compatibility for the semiconductor processing operation such that these components will not corrode or become brittle including seals which will not corrode, swell or become brittle. In addition, the components of the adjustable flow nozzles 104 are selected from material(s) that are thermally stable throughout the operating range of the adjustable flow manifold 102 and provide proper mechanical integrity to retain their respective shape/function while withstanding the relevant operational and process demands of the adjustable flow nozzle system 100. In some embodiments, materials that may be used for manufacturing components of the adjustable flow nozzles 104 may include stainless steel (or other metal alloys) for use with solvents as well as PFA, PTFE, ECTFE, PVDF, PP, HADPE, etc. for use with corrosives and potentially solvents. In some embodiments, common materials and elastomers for manufacturing of the seals 191, 192 and 193 may include Kalrez, silicone, Viton, and PTFE.

Test Results

Referring to FIGS. 47 and 48, test results for the adjustable flow nozzle system 100 are shown. The test was conducted on a single adjustable flow nozzle manifold 102 with five adjustable flow nozzles 104. FIG. 47 shows a graph that illustrates how fluid flow is reduced as a function of the percentage of scale, parametrized for all five adjustable flow nozzles 104. FIG. 48 shows the same data from FIG. 47, but now as a non-tuned distribution of fluid flow collected across the adjustable flow manifold 102 using the same percentage of scale on each adjustable flow nozzle 104, and then parameterized by the percentage of scale. The data illustrated in these graphs shows the ability of the adjustable flow nozzles 104 to decrease the fluid flow as the overlap between the inlet openings 153/171 is reduced from a maximum flow rate to essentially zero flow rate. As such, the data clearly demonstrate significant granularity for adjustment (e.g., a broad operating range) and hence implies that a plurality of nozzles (as would be incorporated into a manifold) can be individually adjusted to achieve matching flow rates through each adjustable flow rate nozzle 104. As shown, a variation exists in the data (particularly at the 0 percentage setting) due to the precision of this adjustment and the manufacturing tolerances of the prototype nozzles 104 used in this test.

It should be understood from the foregoing that, while particular embodiments have been illustrated and described, various modifications can be made thereto without departing from the spirit and scope of the invention as will be apparent to those skilled in the art. Such changes and modifications are within the scope and teachings of this invention as defined in the claims appended hereto.

What is claimed is:

1. An adjustable flow nozzle system comprising:
   an adjustable flow manifold comprising:
      a manifold body defining an axial channel that extends between a distal end portion defining a distal opening and a proximal end portion defining a proximal opening;
      a plurality of access openings formed along a first side of the manifold body; and
      a plurality of apertures formed on an opposite second side of the manifold body;

wherein the plurality of access openings and the plurality of apertures communicate with the axial channel; and a plurality of adjustable flow nozzles coupled to a respective one of the plurality of apertures, each of the plurality of adjustable flow nozzles comprising:

a spray nozzle configured for providing a fluid pathway for a fluid exiting the adjustable flow nozzle;

a stem retainer engaged to the spray nozzle, the stem retainer defining a first inlet opening and an axial opening in fluid flow communication with a first chamber; and a nozzle retainer engaged to the spray nozzle, wherein the nozzle retainer defines a second inlet opening in communication with a second chamber and wherein the stem retainer is configured to be rotatably disposed within the second chamber of the nozzle retainer such that the first inlet opening of the stem retainer is in an overlapping arrangement with the second inlet opening of the nozzle retainer such that a collective opening is formed between the first inlet opening of the stem retainer and the second inlet opening of the nozzle retainer as the stem retainer is rotated; and an adjuster in operative engagement with the stem retainer for causing rotation of the stem retainer relative to the nozzle retainer such that the cross-sectional area of collective opening is adjusted as the stem retainer is rotated, wherein the nozzle retainer is fixed in position relative to the rotatable stem retainer.

2. The adjustable flow nozzle system of claim 1, wherein adjusting the cross-sectional area of the collective opening adjusts the flow rate through each of the plurality of adjustable flow nozzles.

3. The adjustable flow nozzle system of claim 1, wherein the adjuster defines a first key slot and a second key slot for providing respective engagement points to rotate the stem retainer relative to the nozzle retainer.

4. The adjustable flow nozzle system of claim 1, wherein the flow rate exiting each of the plurality of adjustable flow nozzles is within a range between a minimum flow rate and a maximum flow rate.

5. The adjustable flow nozzle system of claim 1, wherein the flow rate of each adjustable flow nozzle is adjusted through the selective overlap of the first inlet opening of the stem retainer with the second inlet opening of the nozzle retainer such that each adjustable flow nozzle is adjustable between a minimum flow rate when minimum overlap between the first inlet opening and the second inlet opening occurs and a maximum flow rate when maximum overlap between the first inlet opening and the second inlet opening occurs.

6. The adjustable flow nozzle system of claim 1, further comprising:

a first key having an elongated key body defining a proximal portion and a distal portion and having at least one key element extending from the proximal portion of the elongated key body, the at least one key element being configured to engage the nozzle retainer to maintain the nozzle retainer in a stationary position; and a second key configured to engage the adjuster for rotating the adjuster and the stem retainer together relative to the nozzle retainer.

7. The adjustable flow nozzle system of claim 1, wherein the fluid enters the axial channel of the adjustable flow nozzle system through the proximal opening, wherein the axial channel is in fluid flow communication with each of the plurality of adjustable flow nozzles such that the fluid enters the collective opening of one or more of the adjustable flow nozzles and wherein the fluid exits the one or more adjustable flow nozzles through the spray nozzle of the adjustable flow nozzle.

8. The adjustable flow nozzle system of claim 1, wherein the manifold further comprises a plurality of nozzle cavities in communication with the axial channel and wherein each of the plurality of adjustable flow nozzles is disposed within a respective one of the plurality of nozzle cavities.

9. A method for adjusting the flow rate for an adjustable flow nozzle system comprising:

providing an adjustable flow manifold comprising:

a manifold body defining an axial channel that extends between a distal end portion defining a distal opening and a proximal end portion defining a proximal opening;

a plurality of access openings formed along one side of the manifold body;

a plurality of apertures formed on the opposite side of the manifold body, wherein the plurality of access openings and apertures communicate with the axial channel; and a plurality of adjustable flow nozzles coupled to a respective one of the plurality of apertures, each of the plurality of adjustable flow nozzles comprising:

a spray nozzle configured for providing a fluid pathway for a fluid exiting the adjustable flow nozzle;

a stem retainer engaged to the spray nozzle, the stem retainer defining a first inlet opening and an axial opening in fluid flow communication with a first chamber;

a nozzle retainer engaged to the spray nozzle, wherein the nozzle retainer defines a second inlet opening in communication with a second chamber and wherein the stem retainer is configured to be rotatably disposed within the second chamber of the nozzle retainer such that the first inlet opening of the stem retainer is in an overlapping arrangement with the second inlet opening of the nozzle retainer such that a collective opening is formed between the first inlet opening of the stem retainer and the second inlet opening of the nozzle retainer as the stem retainer is rotated; and an adjuster in operative engagement with the stem retainer for causing rotation of the stem retainer relative to the nozzle retainer such that the cross-sectional area of collective opening is adjusted as the stem retainer is rotated;

inserting a first key having an elongated key body defining a proximal portion and a distal portion through one of the plurality of apertures, the first key further comprising at least one key element extending from the proximal portion of the elongated key body;

engaging the at least one key element of the first key with the nozzle retainer to maintain the nozzle retainer in a stationary position;

engaging a second key with the adjuster; and rotating the second key such that the stem retainer is rotated relative to the stationary nozzle retainer for adjusting the cross-sectional area and flow rate through the collective opening.

10. The method of claim 9, wherein rotation of the stem retainer relative to the nozzle retainer adjusts the flow rate of each adjustable flow nozzle within a range between a minimum flow rate and a maximum flow rate.

11. The method of claim 9, wherein each of the plurality of adjustable flow nozzles are operable for individual adjustment.

12. An adjustable flow nozzle apparatus comprising:
a spray nozzle configured for providing a fluid pathway for a fluid exiting the adjustable flow nozzle;
a stem retainer engaged to the spray nozzle, the stem retainer defining a first inlet opening and an axial opening in fluid flow communication with a first chamber;
a nozzle retainer engaged to the spray nozzle, wherein the nozzle retainer defines a second inlet opening in communication with a second chamber and wherein the stem retainer is configured to be rotatably disposed within the second chamber of the nozzle retainer such that the first inlet opening of the stem retainer is in an overlapping arrangement with the second inlet opening of the nozzle retainer such that a collective opening is formed between the first inlet opening of the stem retainer and the second inlet opening of the nozzle retainer as the stem retainer is rotated; and
an adjuster in operative engagement with the stem retainer for causing rotation of the stem retainer relative to the nozzle retainer such that the cross-sectional area of the collective opening is adjusted as the stem retainer is rotated, wherein the adjustable flow nozzle apparatus is configured for engagement within a nozzle cavity of an adjustable flow manifold such that an axial channel of the manifold is in fluid flow communication with the collective opening of the adjustable flow nozzle.

13. The adjustable flow nozzle apparatus of claim 12, further comprising:
a first key having an elongated key body defining a proximal portion and a distal portion and having at least one key element extending from the proximal portion of the elongated key body, the at least one key element being configured to engage the nozzle retainer to maintain the nozzle retainer in a stationary position; and
a second key configured to engage the adjuster for rotating the adjuster and the stem retainer together relative to the nozzle retainer.

14. The apparatus of claim 12, wherein the adjuster defines a first key slot and a second key slot for providing respective engagement points to rotate the stem retainer relative to the nozzle retainer.

15. The apparatus of claim 12, wherein the flow rate of the fluid through the adjustable flow nozzle is adjusted through the selective overlap of the first inlet opening of the stem retainer with the second inlet opening of the nozzle retainer such that the adjustable flow nozzle apparatus is adjustable between a minimum flow rate when minimum overlap between the first inlet opening and the second inlet opening occurs and a maximum flow rate when maximum overlap between the first inlet opening and the second inlet opening occurs.

16. The apparatus of claim 12, wherein the fluid enters the first chamber of the stem retainer through the collective opening defined by the first inlet opening of the stem retainer and the second inlet opening of the nozzle retainer and wherein the fluid enters the spray nozzle through the axial opening of the stem retainer, wherein the fluid leaves the adjustable flow nozzle through the spray nozzle.

17. The apparatus of claim 12, wherein the stem retainer is rotatable relative to the nozzle retainer and wherein an orientation of the second inlet opening of the nozzle retainer is fixed within a nozzle cavity of an adjustable flow manifold.

18. The apparatus of claim 12, wherein a stem portion defined by the stem retainer is engaged with a first chamber defined by the nozzle retainer and wherein a body portion of the stem retainer is engaged with the second chamber of the nozzle retainer, wherein the first chamber is located superior to the second chamber.

* * * * *